United States Patent
Joo et al.

(10) Patent No.: US 10,522,788 B2
(45) Date of Patent: Dec. 31, 2019

(54) ORGANIC LIGHT EMITTING DIODE

(71) Applicant: LG DISPLAY CO., LTD., Seoul (KR)

(72) Inventors: Mun Kyu Joo, Daejeon (KR); Minsoo Kang, Daejeon (KR); Jeamin Moon, Daejeon (KR); Yun Hye Hahm, Daejeon (KR); Seongsu Jang, Daejeon (KR); Jina You, Daejeon (KR); Jaein Lee, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 992 days.

(21) Appl. No.: 14/404,245

(22) PCT Filed: May 31, 2013

(86) PCT No.: PCT/KR2013/004845
§ 371 (c)(1),
(2) Date: Nov. 26, 2014

(87) PCT Pub. No.: WO2013/180535
PCT Pub. Date: Dec. 5, 2013

(65) Prior Publication Data
US 2015/0194635 A1 Jul. 9, 2015

(30) Foreign Application Priority Data
May 31, 2012 (KR) .................. 10-2012-0058936

(51) Int. Cl.
*H01L 51/52* (2006.01)
*H01L 51/50* (2006.01)
*H01L 51/00* (2006.01)

(52) U.S. Cl.
CPC ...... *H01L 51/5268* (2013.01); *H01L 51/0072* (2013.01); *H01L 51/5068* (2013.01); *H01L 51/5084* (2013.01); *H01L 51/0059* (2013.01); *H01L 51/0094* (2013.01)

(58) Field of Classification Search
None
See application file for complete search history.

(56) References Cited

U.S. PATENT DOCUMENTS

| | | |
|---|---|---|
| 4,780,536 A | 10/1988 | Czarnik et al. |
| 5,645,948 A | 7/1997 | Shi et al. |
| 6,436,559 B1 | 8/2002 | Ueno et al. |
| 2002/0105005 A1 | 8/2002 | Sea et al. |
| 2002/0158242 A1 | 10/2002 | Son et al. |
| 2003/0165715 A1 | 9/2003 | Yoon et al. |
| 2003/0168970 A1 | 9/2003 | Tominaga et al. |
| 2006/0251922 A1* | 11/2006 | Liao .................. H01L 51/0051 428/690 |
| 2007/0122656 A1 | 5/2007 | Klubek et al. |

(Continued)

FOREIGN PATENT DOCUMENTS

DE 102010019306 A1 11/2011
EP 1956666 A1 8/2008
(Continued)

*Primary Examiner* — Jay Yang
(74) *Attorney, Agent, or Firm* — Dentons US LLP

(57) ABSTRACT

The present specification discloses an organic electroluminescent device including: an anode; a cathode; a light emitting layer provided between the anode and the cathode; and a light scattering layer provided between the light emitting layer and the cathode.

31 Claims, 13 Drawing Sheets

(56) References Cited

U.S. PATENT DOCUMENTS

| | | |
|---|---|---|
| 2007/0200490 A1 | 8/2007 | Kawamura et al. |
| 2007/0262303 A1* | 11/2007 | Yan .................... H01L 51/0012 257/40 |
| 2007/0267958 A1 | 11/2007 | Kitazawa et al. |
| 2008/0116784 A1 | 5/2008 | Krummacher et al. |
| 2008/0284313 A1 | 11/2008 | Berben et al. |
| 2009/0115316 A1* | 5/2009 | Zheng ................ C07D 471/14 313/504 |
| 2010/0108990 A1 | 5/2010 | Hosokawa et al. |
| 2010/0289008 A1* | 11/2010 | Jang ................... H01L 51/5052 257/40 |
| 2011/0057176 A1 | 3/2011 | Kang et al. |
| 2011/0062481 A1 | 3/2011 | Oyamada |
| 2011/0284831 A1 | 11/2011 | Kaiser et al. |
| 2011/0309307 A1 | 12/2011 | Zeika et al. |
| 2011/0315975 A1 | 12/2011 | Kai et al. |
| 2012/0007071 A1 | 1/2012 | Joo et al. |
| 2013/0053555 A1 | 2/2013 | Parham et al. |
| 2014/0203273 A1 | 7/2014 | Kubota |
| 2014/0374737 A1 | 12/2014 | Nowatari et al. |

FOREIGN PATENT DOCUMENTS

| | | |
|---|---|---|
| EP | 2 192 634 A1 | 6/2010 |
| EP | 2192634 A1 | 6/2010 |
| EP | 2309824 A1 | 4/2011 |
| JP | 2004107263 A | 4/2004 |
| JP | 2005063704 A | 3/2005 |
| JP | 2007039405 A | 2/2007 |
| JP | 2009-514178 A | 4/2009 |
| JP | 2009514178 A | 4/2009 |
| JP | 2009-224593 A | 10/2009 |
| JP | 2009224593 A | 10/2009 |
| JP | 2012-094301 A | 5/2012 |
| JP | 2012-94301 A | 5/2012 |
| JP | 2012094301 A | 5/2012 |
| JP | 2012519944 A | 8/2012 |
| KR | 1020030067773 A | 8/2003 |
| KR | 1020070052764 A | 5/2007 |
| KR | 1020070118711 A | 12/2007 |
| KR | 1020080081255 A | 9/2008 |
| KR | 1020100105481 A | 9/2010 |
| KR | 1020110134377 A | 12/2011 |
| TW | 582121 | 4/2004 |
| TW | 200952546 A | 12/2009 |
| WO | 2005-064995 A1 | 7/2005 |
| WO | 2005097756 A1 | 10/2005 |
| WO | 200701499 A1 | 5/2007 |
| WO | 2009141903 A1 | 11/2009 |
| WO | 2010/075836 A2 | 7/2010 |
| WO | 2010/107249 A2 | 9/2010 |
| WO | 2010107249 A2 | 9/2010 |
| WO | 2011-157385 A2 | 12/2011 |
| WO | 2011157385 A2 | 12/2011 |
| WO | 2013/042745 A1 | 3/2013 |

\* cited by examiner

[Figure 1]
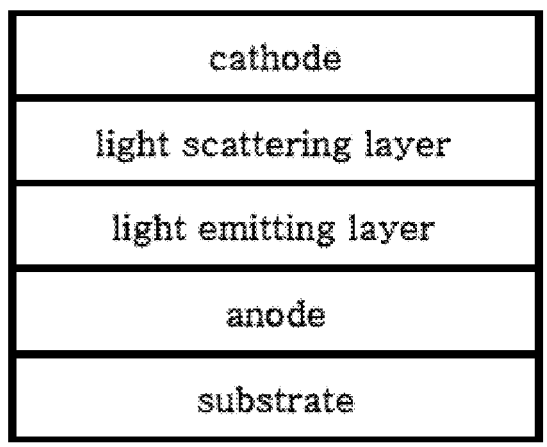
[Figure 2]
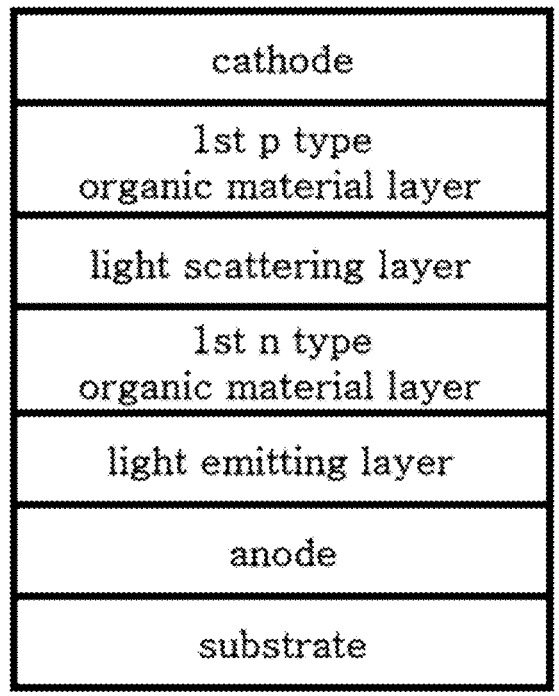

[Figure 3]
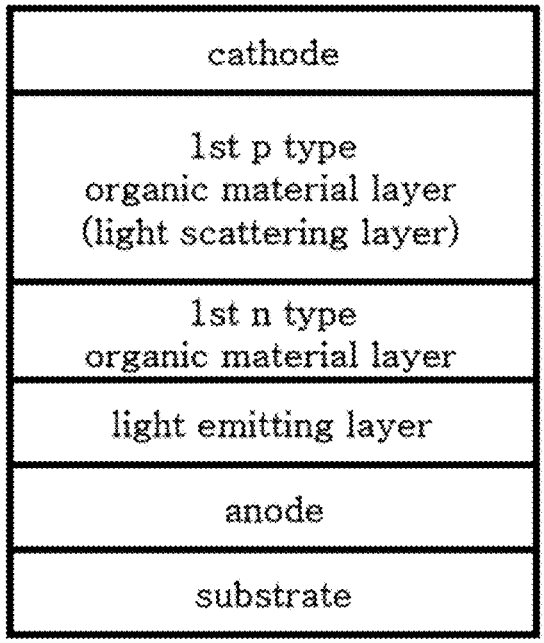
[Figure 4]
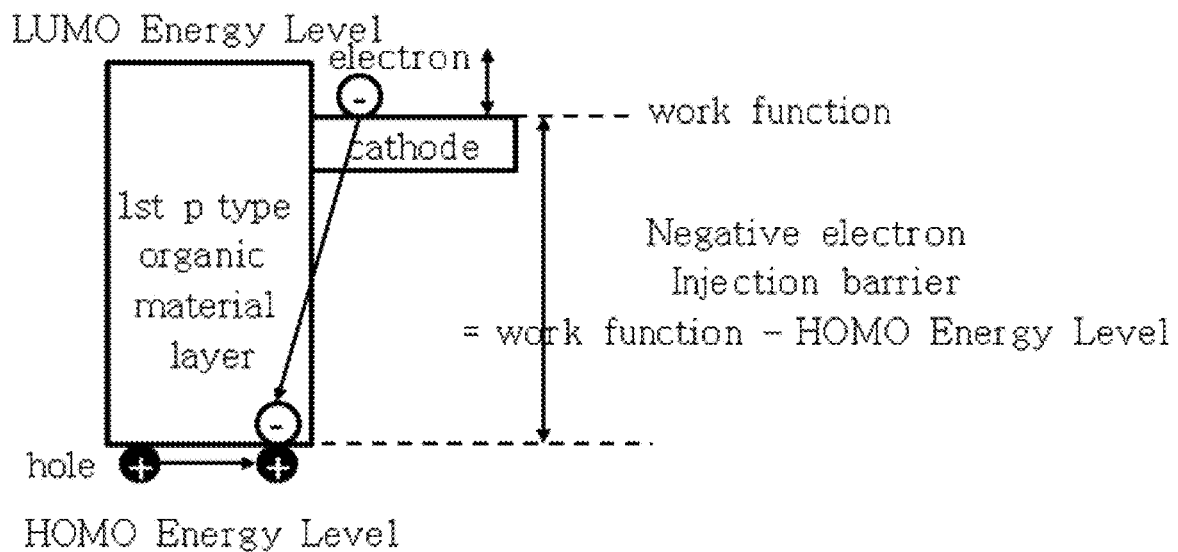

[Figure 5]
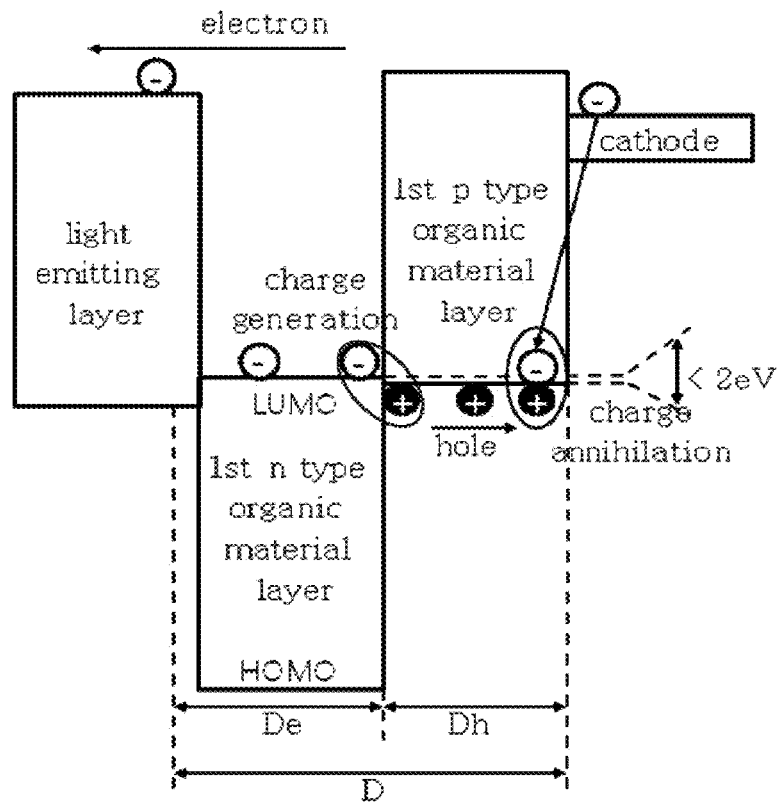
[Figure 6]
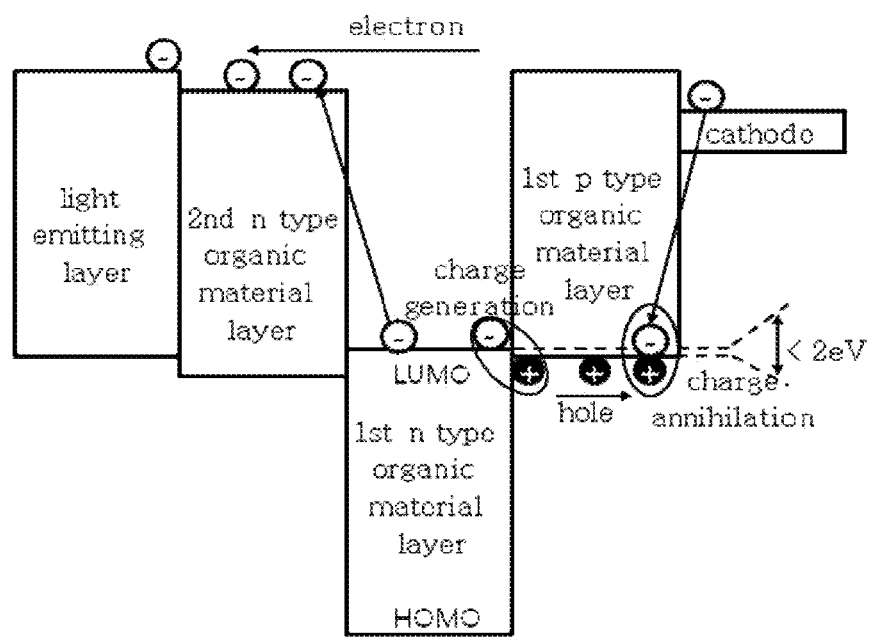

[Figure 7]
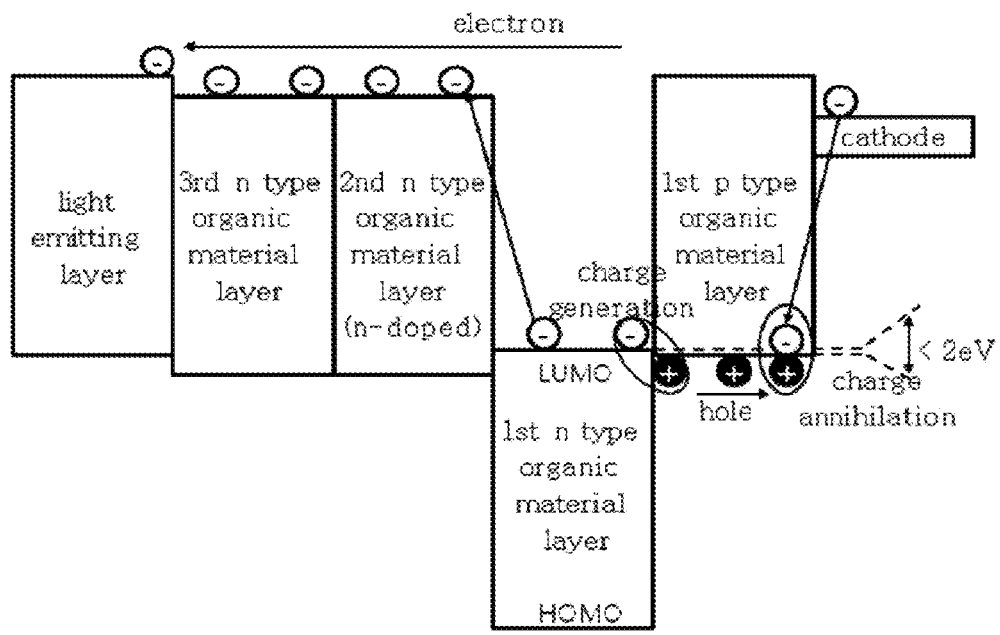
[Figure 8]
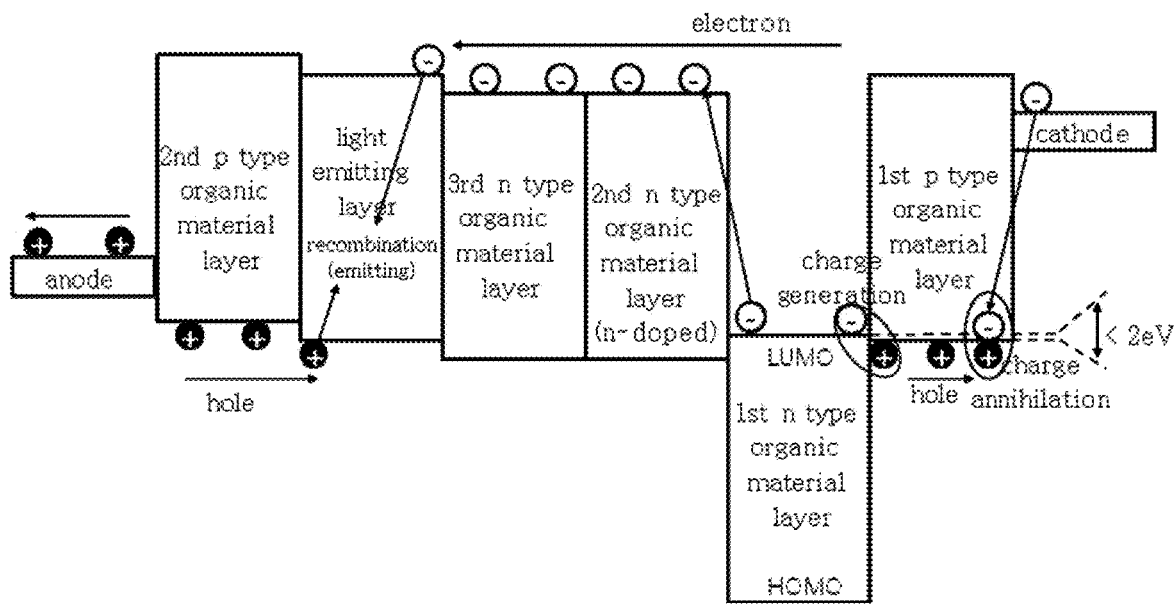

[Figure 9]
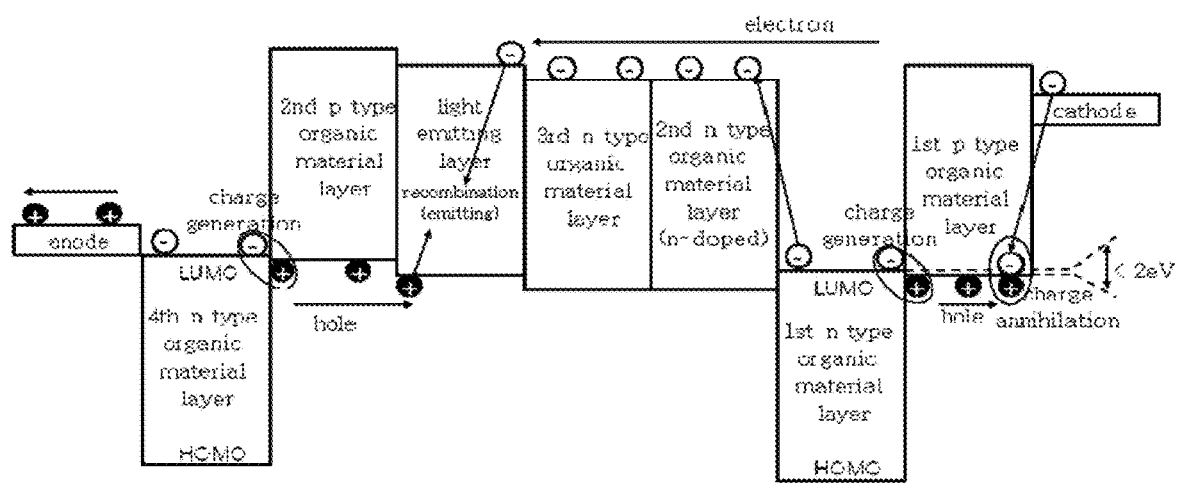
[Figure 10A]
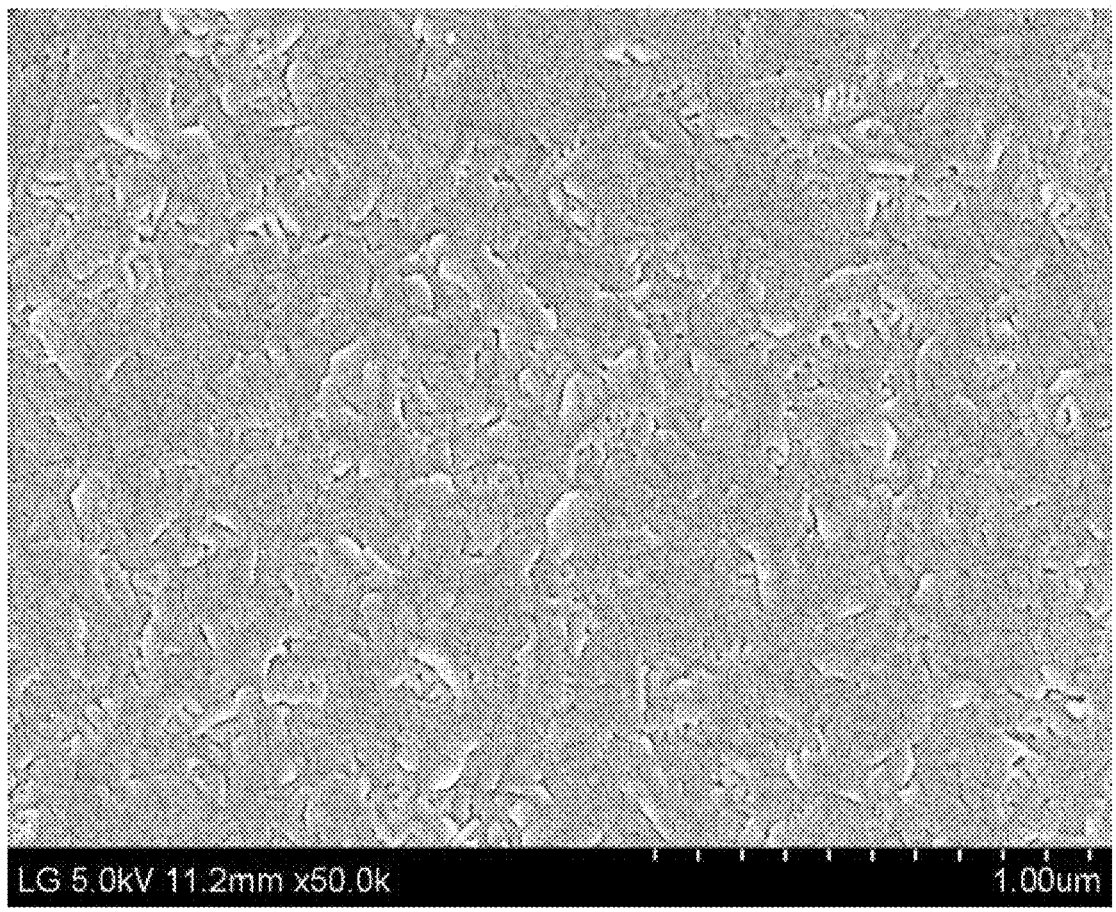

[Figure 10B]
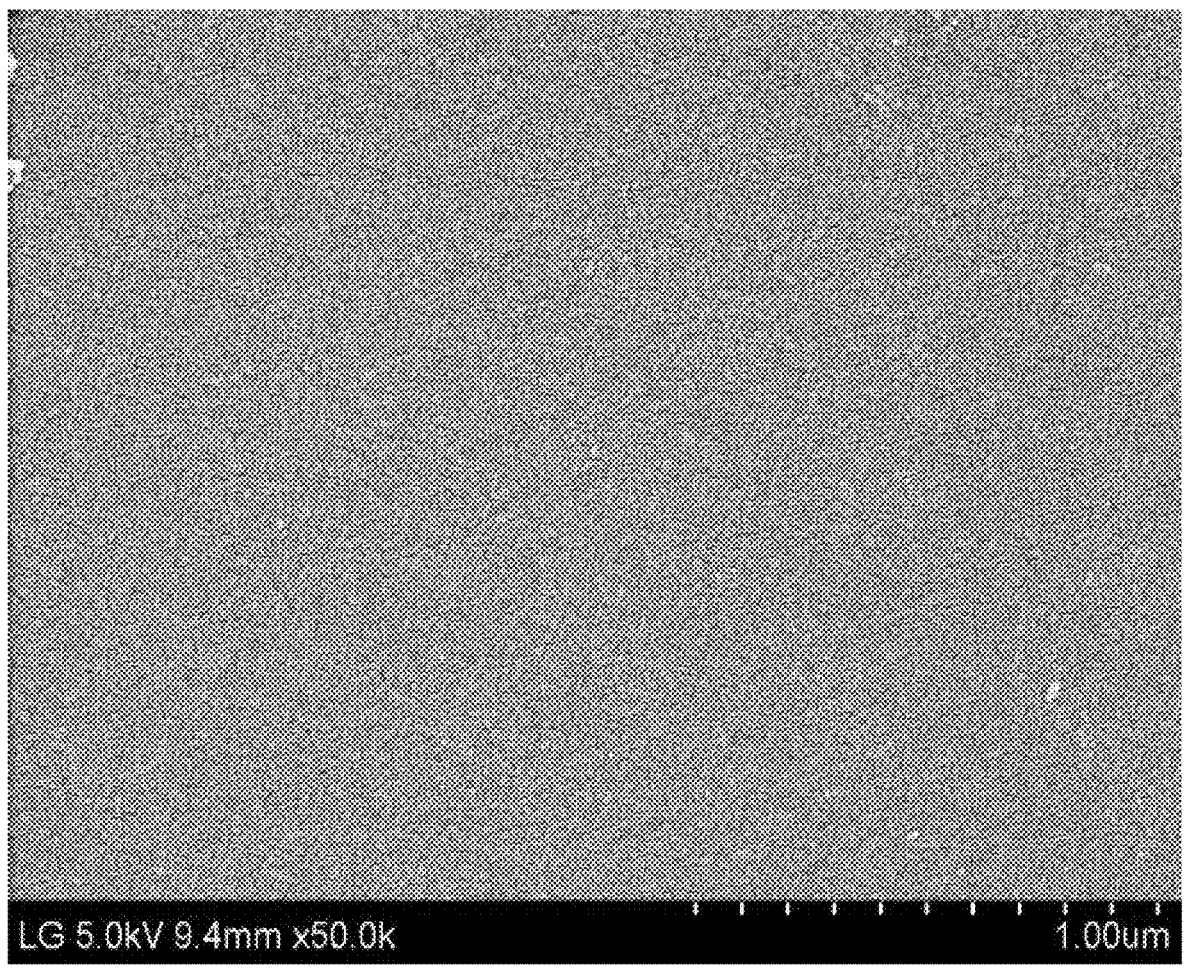

[Figure 10C]
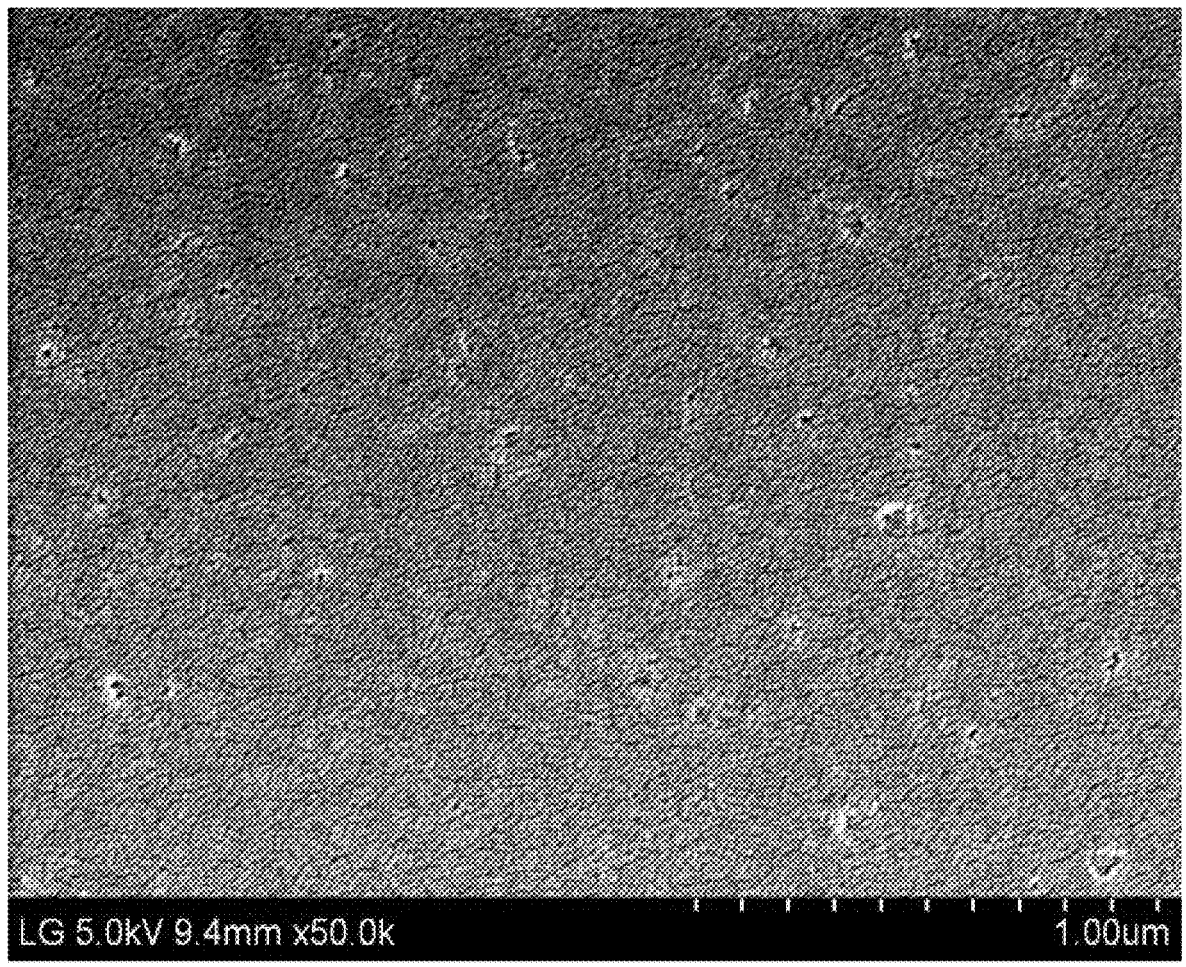

[Figure 10D]
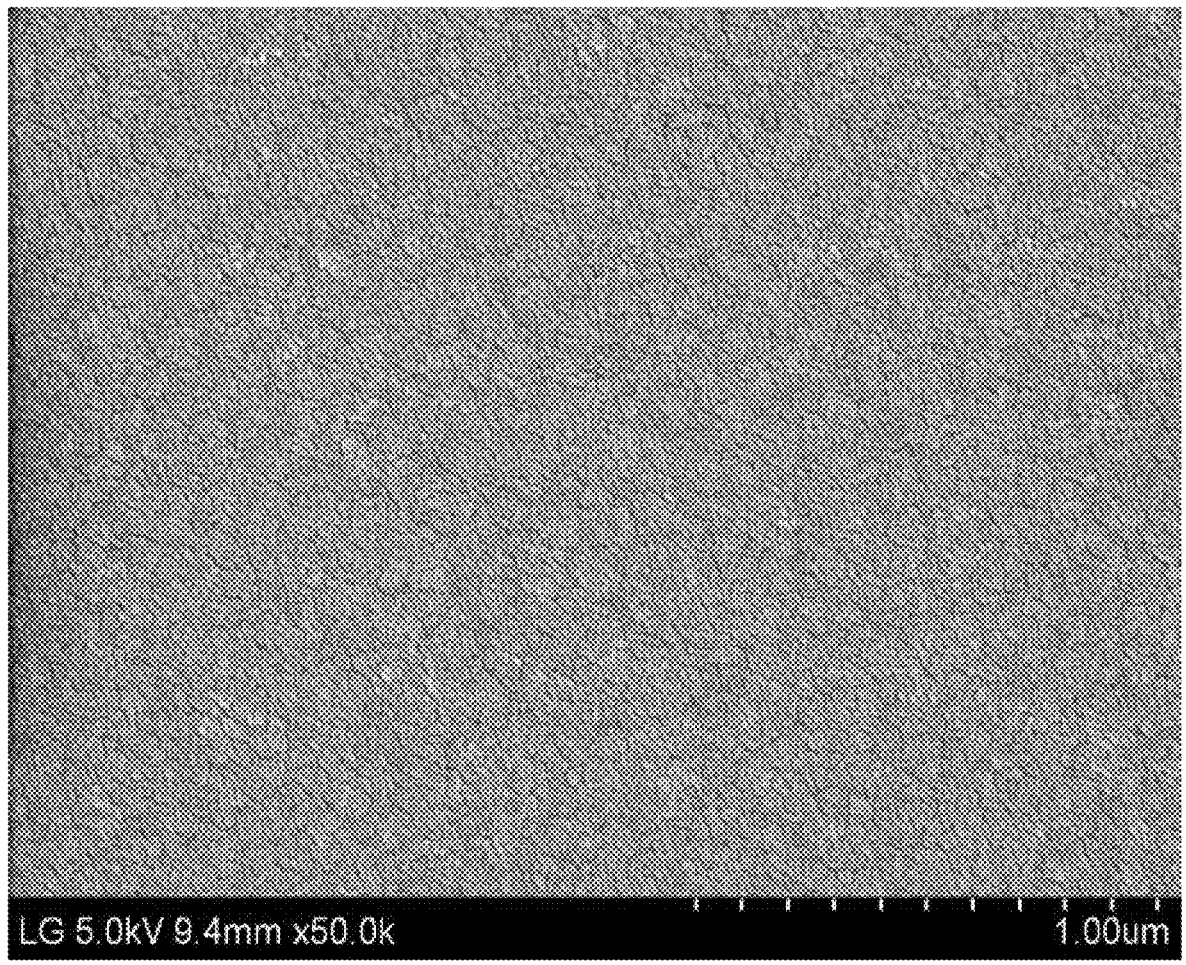

[Figure 10E]
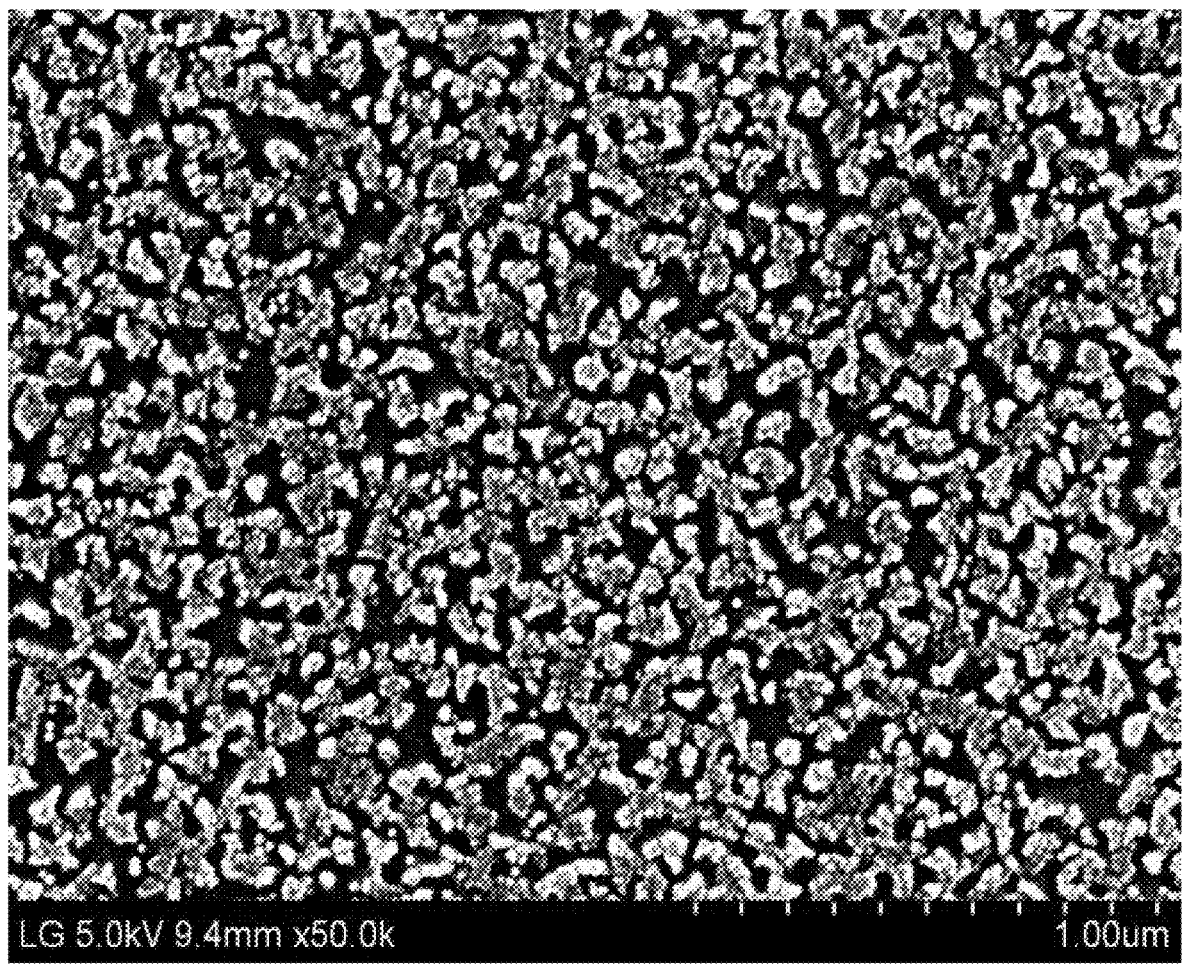

[Figure 10F]
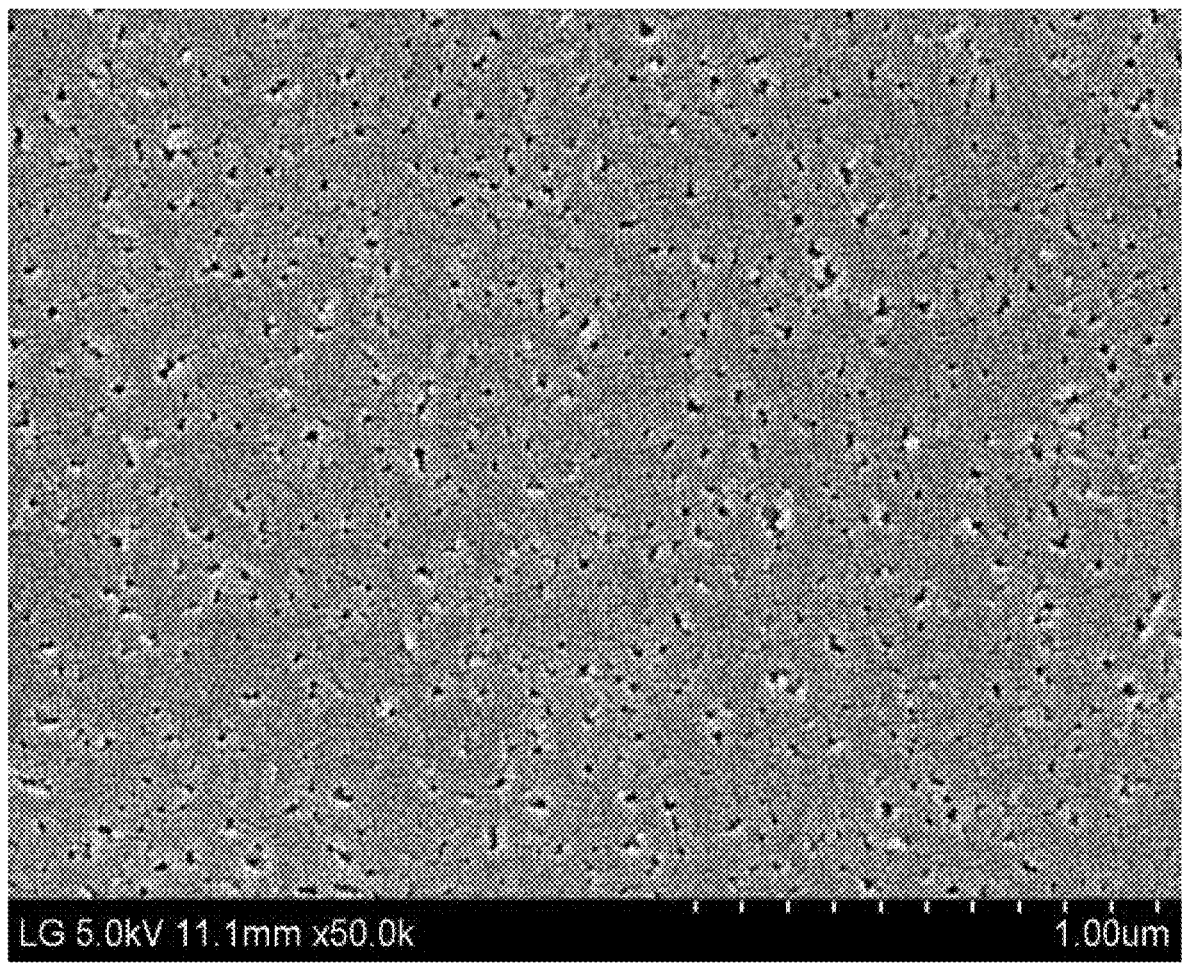

[Figure 11A]
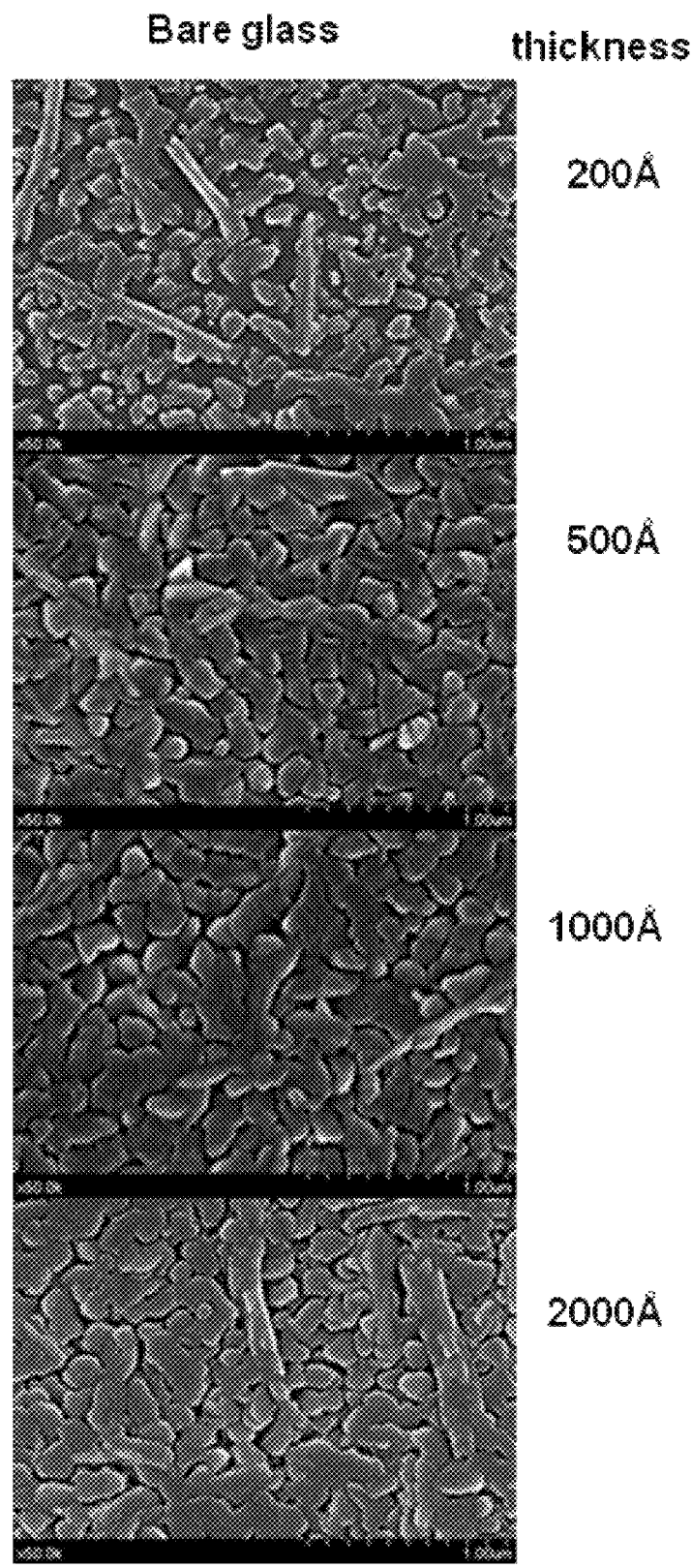

[Figure 11B]
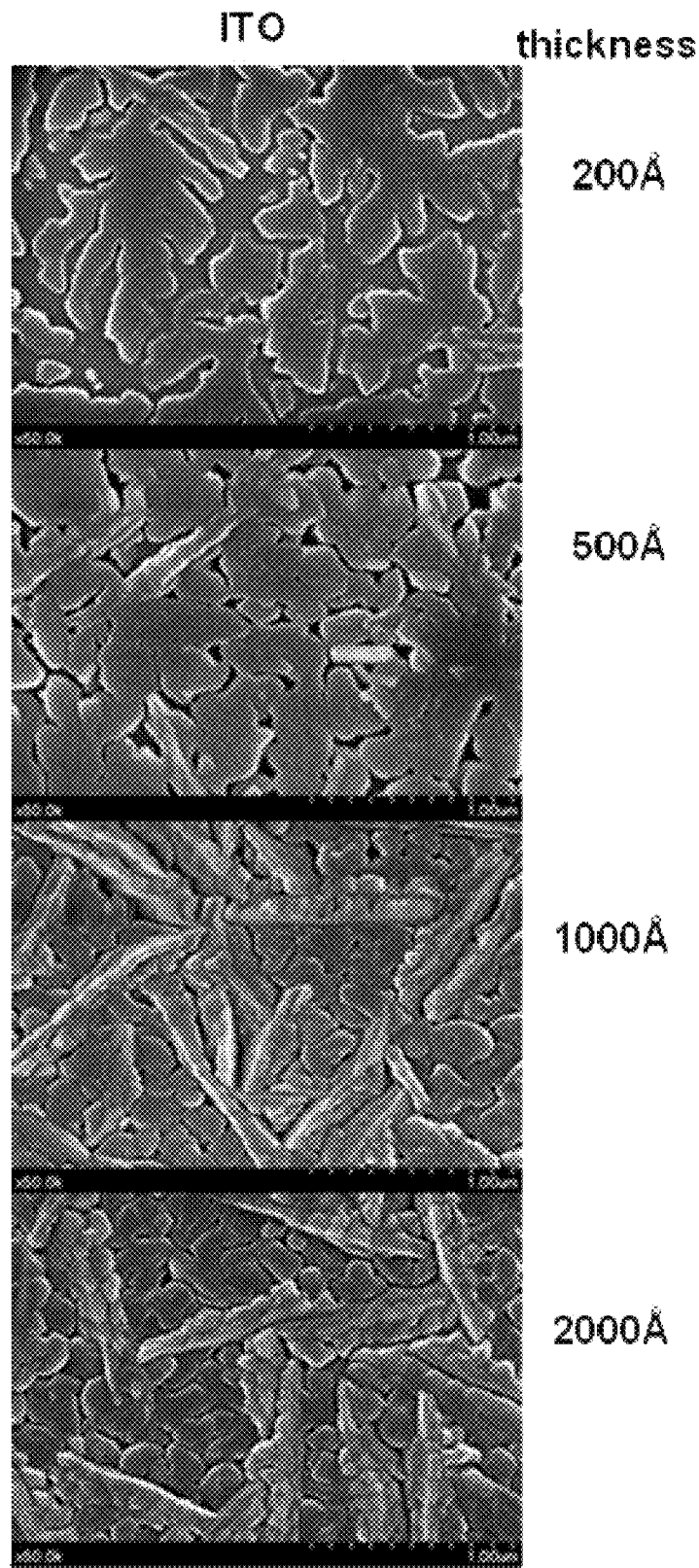

[Figure 11C]
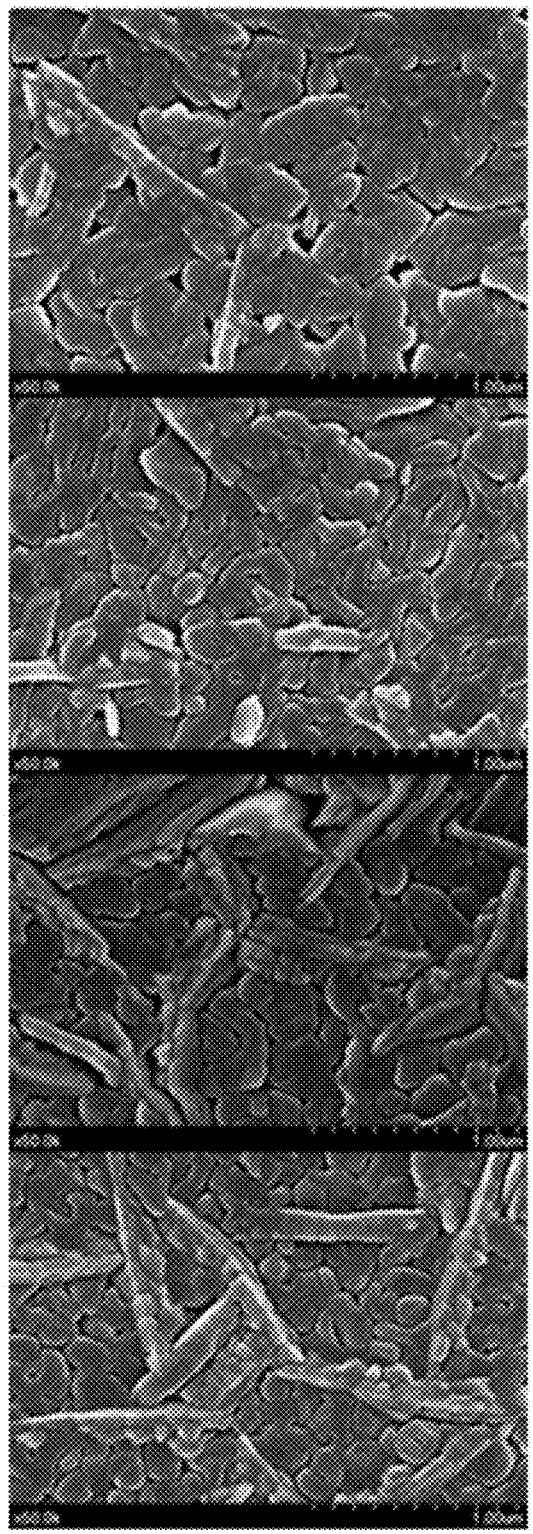

ORGANIC LIGHT EMITTING DIODE

TECHNICAL FIELD

This application is a 35 USC § 371 National Stage entry of International Application No. PCT/KR2013/004845, filed on May 31, 2013, which claims priority of Korean Application No. 10-2012-0058936, filed on May 31, 2012, which is hereby incorporated by reference in its entirety.

BACKGROUND ART

An organic electroluminescent device converts a current into visible light by injecting electrons and holes from two electrodes into an organic material layer. The organic electroluminescent device may have a multilayer structure including two or more organic material layers. For example, the organic electroluminescent device may further include an electron or hole injection layer, an electron or hole blocking layer, or an electron or hole transporting layer, if necessary, in addition to a light emitting layer.

Recently, as the use of the organic electroluminescent device has been diversified, studies on materials, which may improve the performance of the organic electroluminescent device, have been actively conducted.

DETAILED DESCRIPTION OF THE INVENTION

Technical Problem

The present specification describes an organic electroluminescent device having a novel structure.

Technical Solution

An organic electroluminescent device according to an exemplary embodiment of the present specification includes: an anode; a cathode; and a light emitting layer provided between the anode and the cathode; and further includes a light scattering layer provided between the light emitting layer and the cathode.

According to another exemplary embodiment of the present specification, the organic electroluminescent device includes: a first electric charge transporting passage provided between the light emitting layer and the cathode; and a second electric charge transporting passage provided between the light emitting layer and the anode, in which the first electric charge transporting passage includes: a first p-type organic material layer associated with the cathode; and a first n-type organic material layer provided between the first p-type organic material layer and the light emitting layer, and the light scattering layer is the first p-type organic material layer, or is provided between the first p-type organic material layer and the first n-type organic material layer.

According to still another exemplary embodiment of the present specification, the organic electroluminescent device includes: a buffer layer provided between the light emitting layer and the cathode, in which the buffer layer includes: a first p-type organic material layer associated with the cathode; and a first n-type organic material layer provided between the first p-type organic material layer and the light emitting layer, and the light scattering layer is the first p-type organic material layer, or is provided between the first p-type organic material layer and the first n-type organic material layer.

According to yet another exemplary embodiment of the present specification, the organic electroluminescent device includes: a first p-type organic material layer provided between the light emitting layer and the cathode; and a first n-type organic material layer provided between the light emitting layer and the first p-type organic material layer, and the light scattering layer is the first p-type organic material layer, or is provided between the first p-type organic material layer and the first n-type organic material layer.

Advantageous Effects

Exemplary embodiments according to the present specification may improve light extraction efficiency by changing the passage of light generated in the device by the light scattering layer.

BRIEF DESCRIPTION OF DRAWINGS

FIGS. 1 to 3 illustrate stacked structures of organic material layers of organic electroluminescent devices according to exemplary embodiments of the present specification, respectively.

FIG. 4 illustrates a movement of an electric charge between a first p-type organic material layer and a cathode in the organic electroluminescent devices illustrated in FIGS. 2 and 3.

FIG. 5 illustrates a movement of electric charges among a light emitting layer, a first n-type organic material layer, the first p-type organic material layer, and the cathode in the organic electroluminescent device illustrated in FIG. 3.

FIGS. 6 and 7 illustrate a movement of electric charges among a light emitting layer, a first n-type organic material layer, a first p-type organic material layer, and a cathode in organic electroluminescent devices according to other exemplary embodiments of the present specification.

FIGS. 8 and 9 illustrate a movement of electric charges between an anode and a cathode in organic electroluminescent devices according to other exemplary embodiments of the present invention.

FIGS. 10A to 10F are SEM photographs illustrating surface characteristics of light scattering layers manufactured in Experimental Examples.

FIGS. 11A to 11C are SEM photographs illustrating surface characteristics of organic material layers formed in the Experimental Examples.

BEST MODE

Hereinafter, exemplary embodiments exemplified in the present specification will be described in detail.

In the present specification, an n-type means n-type semiconductor characteristics. In other words, an n-type organic material layer is an organic material layer having a characteristic that electrons are injected or transported at the LUMO energy level, and an organic material layer having a characteristic of a material having an electron mobility greater than a hole mobility. Conversely, a p-type means p-type semiconductor characteristics. In other words, a p-type organic material layer is an organic material layer having a characteristic that holes are injected or transported at the highest occupied molecular orbital (HOMO) energy level, and an organic material layer having a characteristic of a material having a hole mobility greater than an electron mobility. In the present specification, "an organic material layer which transports electric charges at the HOMO energy level" and the p-type organic material layer may be used as having the same meaning. Further, "an organic material layer which transports electric charges at the LUMO energy level" and the n-type organic material layer may be used as having the same meaning.

In the present specification, an energy level means a size of energy. Accordingly, even when an energy level is expressed in a negative (−) direction from a vacuum level, the energy level is interpreted to mean an absolute value of the corresponding energy value. For example, the HOMO energy level means a distance from the vacuum level to the highest occupied molecular orbital. In addition, the LUMO energy level means a distance from the vacuum level to the lowest unoccupied molecular orbital.

In the present specification, an electric charge means an electron or a hole.

In the present specification, "an electric charge transporting passage" means a passage through which electrons or holes are transported. The passage may be formed at the interlayer interface, and may be formed through an additional layer. For example, a first electric charge transporting passage in the exemplary embodiment includes a first p-type organic material layer and a first n-type organic material layer. Furthermore, in the exemplary embodiment, a second electric charge transporting passage may include only an interface between an anode and a light emitting layer, and may include a layer additionally provided between the anode and the light emitting layer.

In the present specification, "non-doped" means that an organic material constituting an organic material layer is not doped with a material having other properties. For example, when a "non-doped" organic material layer is a p-type material, the "non-doped" may mean that the organic material layer is not doped with an n-type material. Further, the "non-doped" may mean that a p-type organic material is not doped with an inorganic material other than an organic material. Since organic materials having the same properties, for example, p-type characteristics are similar to each other in terms of properties, the two or more thereof may be mixed and used. The non-doped organic material layer means that the layer is composed of only materials having the same characteristics in properties thereof.

According to an exemplary embodiment of the present specification, provided is an organic electroluminescent device including: an anode; a cathode; a light emitting layer provided between the anode and the cathode; and a light scattering layer provided between the light emitting layer and the cathode. FIG. 1 illustrates a stacked structure of a layer in the organic electroluminescent device according to an exemplary embodiment of the present specification. According to FIG. 1, the anode, the light emitting layer, the light scattering layer, and the cathode are stacked on a substrate.

The light scattering layer may include a light scattering structure provided in or on the surface of the layer.

According to an exemplary embodiment of the present specification, the light scattering structure may be formed by a particle structure formed by constituting a cluster of molecules of a material included in the light scattering layer. Here, the particle structure includes an individual particle formed by constituting a cluster of molecules or a structure formed by agglomerating these particles. Here, the structure formed by agglomerating particles means the at least a part of the surface or backbone of each of the particles maintains a form before being agglomerated. Accordingly, roughness is produced in or on a surface of a light scattering layer by the agglomerated structure while the structure of individual particles or particles is(are) maintaining the form of at least a part of the surface or backbone before being agglomerated.

For example, a degree of roughness caused by a particle structure formed by constituting a cluster of molecules of a material included in the light scattering layer may be from 2 nm to 50 nm. Here, the degree of roughness is an Ra value in atomic force microscope (AFM) data. Here, the Ra is calculated by an average value of differences between surface heights on the surface having roughness.

According to the exemplary embodiment, light extraction efficiency by light scattering may be maximized by providing a light scattering layer having roughness according to the aforementioned particle structure between the cathode and the light emitting layer. Specifically, light emitting efficiency may be maximized by minimizing light absorption according to a surface plasma. In addition, when the light scattering layer is associated with the cathode and one or more organic material layers are provided between the light scattering layer and the light emitting layer, thickness uniformity of the organic material layer may be achieved and deterioration in device efficiency may be prevented, compared to the case of including a light scattering structure in the light emitting layer or the organic material layer which is in contact with the light emitting layer.

According to an exemplary embodiment of the present specification, the material included in the light scattering layer is an organic material. In other words, a light scattering function may be imparted by roughness according to the particle structure formed by constituting a cluster of organic material particles.

The organic material of a specific type may have a particle structure having roughness as described above only by forming a layer by a deposition method.

The particle structure may be formed by depositing two or more materials at a specific component ratio, and a particle structure having the aforementioned roughness may also be formed by only depositing even one material by intrinsic physical properties of the material.

Depending on the type of material included in the light scattering layer, a size of particles formed by constituting a cluster of particles of a material when the light scattering layer is formed may be varied. For example, a particle diameter of particles formed by constituting a cluster of molecules of the material included in the light scattering layer may be several micron, for example, in a range from 0.5 micrometer to 30 micrometers, specifically, from 1 micron to 10 micron. The above-described roughness may be controlled according to the particle diameter of particles. In order to control the particle diameter of the particle, it is possible to select the type of material and the combination or the combination ratio of materials for forming the light scattering layer.

Even depending on the thickness of the light scattering layer, the size or roughness of particle formed by constituting a cluster of molecules of the material included in the light scattering layer may be varied. The thickness of the light scattering layer may be selected by the type of material or process conditions, and the light scattering layer may be formed to have a thickness, for example, from 20 nm to 500, and specifically, from 50 nm to 200 nm.

According to another exemplary embodiment of the present specification, the light scattering layer is provided to be in physical contact with the cathode. At this time, the surface which is in contact with the light scattering layer of the cathode may have a form of the particle structure having roughness on the surface which is in contact with the cathode of the light scattering layer. According to an example, even a surface opposite to the surface which is in contact with the light scattering layer of the cathode may have a form of a particle structure having roughness on a surface which is in contact with the cathode of the light scattering layer.

According to still another exemplary embodiment of the present invention, the organic electroluminescent device includes: a first electric charge transporting passage provided between the light emitting layer and the cathode; and a second electric charge transporting passage provided between the light emitting layer and the anode, in which the first electric charge transporting passage includes: a first p-type organic material layer associated with the cathode; and a first n-type organic material layer provided between the first p-type organic material layer and the light emitting layer, and the light scattering layer is the first p-type organic material layer, or is provided between the first p-type organic material layer and the first n-type organic material layer.

According to yet another exemplary embodiment of the present invention, the organic electroluminescent device includes: a buffer layer provided between the light emitting layer and the cathode, in which the buffer layer is associated with the cathode and includes: a first p-type organic material layer; and a first n-type organic material layer provided between the first p-type organic material layer and the light emitting layer, and the light scattering layer is the first p-type organic material layer, or is provided between the first p-type organic material layer and the first n-type organic material layer.

According to still yet another exemplary embodiment of the present invention, the organic electroluminescent device includes: a first p-type organic material layer provided between the light emitting layer and the cathode; and a first n-type organic material layer provided between the light emitting layer and the first p-type organic material layer, in which the light scattering layer is the first p-type organic material layer, or is provided between the first p-type organic material layer and the first n-type organic material layer.

When the light scattering layer is provided between the first p-type organic material layer and the first n-type organic material layer, it is possible to simultaneously exhibit effects to be described below by the light scattering layer and the first p-type organic material layer, and the first p-type organic material layer may improve adhesion characteristic between the light scattering layer and the cathode. FIG. 2 illustrates an example of the organic electroluminescent device exhibiting the effects.

According to FIG. 2, an anode, a light emitting layer, a first n-type organic material layer, a light scattering layer, a first p-type organic material layer, and a cathode are sequentially stacked on a substrate. FIG. 2 illustrates an example in which the anode is provided on the substrate, but the case where the cathode is provided on the substrate is also included in a range of the present exemplary embodiment. For example, the organic electroluminescent device according to an exemplary embodiment of the present specification may have a structure in which the cathode, the first p-type organic material layer, the light scattering layer, the first n-type organic material layer, the light emitting layer, and the anode are sequentially stacked on the substrate.

When the light scattering layer is the first p-type organic material layer, it is possible to simultaneously exhibit an effect caused by introducing the first p-type organic material layer by introducing one layer, and an effect caused by the light scattering layer. FIG. 3 illustrates an example of the organic electroluminescent device exhibiting the effects.

As an example, the light scattering layer may include a polycyclic condensed ring compound and an aryl amine compound. The light scattering layer including a polycyclic condensed ring compound and an aryl amine compound may be the first p-type organic material layer, or may be provided between the first p-type organic material layer and the n-type organic material layer.

An example of the aryl amine compound includes a compound of the following Formula 1:

[Formula 1]

In Formula 1, $Ar_1$, $Ar_2$, and $Ar_3$ are each independently hydrogen or a hydrocarbon group. At this time, at least one of $Ar_1$, $Ar_2$, and $Ar_3$ may include an aromatic hydrocarbon substitute, and substitutes may be the same as each other, and may be composed of different substitutes. Those which are not an aromatic hydrocarbon among $Ar_1$, $Ar_2$, and $Ar_3$ may be hydrogen; a straight, branched, or cyclic aromatic hydrocarbon; and a heterocyclic group including N, O, S, or Se.

$Ar_1$ to $Ar_3$ may be unsubstituted or substituted with alkyl, aryl, heteroaryl, or arylamine. The alkyl includes a $C_1$ to $C_{20}$ straight or branched alkyl. The aryl includes a $C_6$ to $C_{60}$ monocyclic or polycyclic aryl. The heteroaryl includes a monocyclic or polycyclic heteroaryl including S, O, or Se as a heteroatom. The arylamine includes an amine group substituted with one or two of the $C_6$ to $C_{60}$ monocyclic or polycyclic aryl.

Examples of the compound of Formula 1 include a compound of the following Formula 1-1 or 1-2.

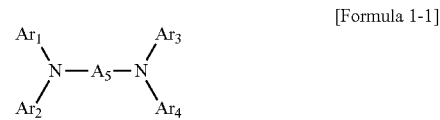

[Formula 1-1]

In Formula 1-1, $Ar_1$ to $Ar_4$ are the same as or different from each other, are each independently a substituted or unsubstituted $C_6$ to $C_{60}$ aryl, and may combine with an adjacent group to form a monocyclic or polycyclic aromatic, aliphatic, or heterocyclic ring, and $Ar_5$ is a substituted or unsubstituted $C_6$ to $C_{60}$ arylene.

According to an exemplary embodiment, in Formula 1-1, $Ar_1$ to $Ar_4$ are the same as or different from each other, and are each independently phenyl, naphthyl, biphenyl, terphenyl, fluorenyl, or a group in which these are substituted with an alkyl such as methyl.

According to an exemplary embodiment, in Formula 1-1, $A_5$ is phenylene, naphthylene, biphenylene, terphenylene, fluorenylene, or a group in which these are substituted with an alkyl such as methyl, an aryl such as phenyl, or an arylamine croup.

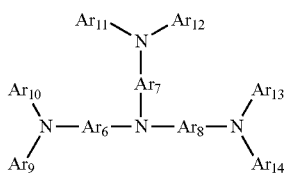

[Formula 1-2]

In Formula 1-2,

Ar$_9$ to Ar$_{14}$ are the same as or different from each other, are each independently a substituted or unsubstituted C$_6$ to C$_{60}$ aryl, and may combine with an adjacent group to form a monocyclic or polycyclic aromatic, aliphatic, or heterocyclic ring, and Ar$_6$ to Ar$_8$ are the same as or different from each other, and are each independently a substituted or unsubstituted C$_6$ to C$_{60}$ arylene.

According to an exemplary embodiment, in Formula 1-2, Ar$_9$ to Ar$_{14}$ are the same as or different from each other, and are each independently phenyl, naphthyl, biphenyl, terphenyl, fluorenyl, or a group in which these are substituted with an alkyl such as methyl.

According to an exemplary embodiment, in Formula 1-2, Ar$_6$ to Ar$_8$ are the same as or different from each other, and are each independently phenylene, naphthylene, biphenylene, terphenylene, fluorenylene, or a group in which these are substituted with an alkyl such as methyl, an aryl such as phenyl, or an arylamine group.

Specific examples of Formula 1 include the following formulas, but the range of exemplary embodiments described in the present specification is not always limited thereto.

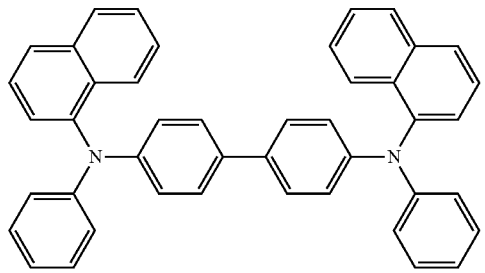

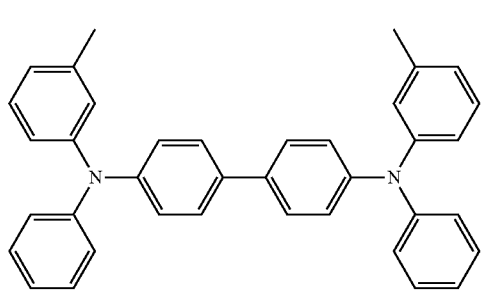

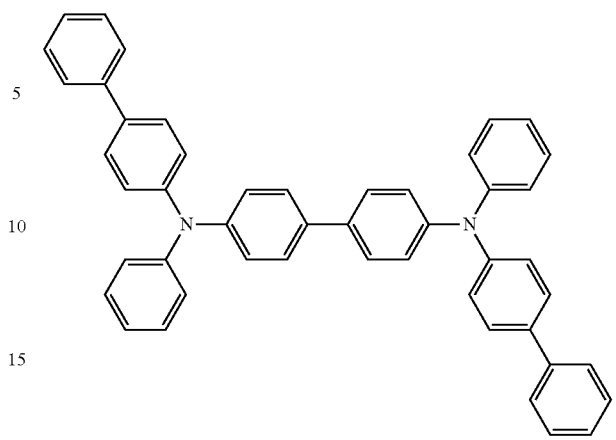

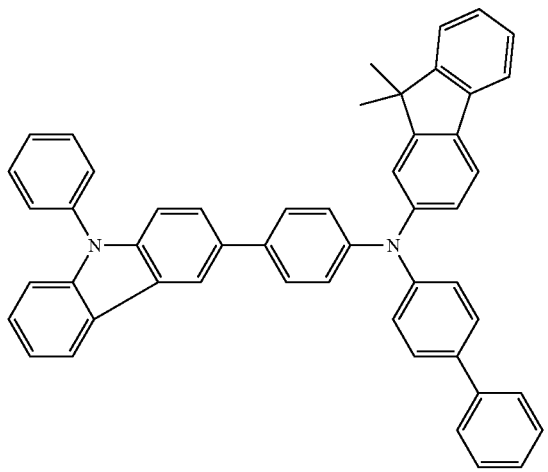

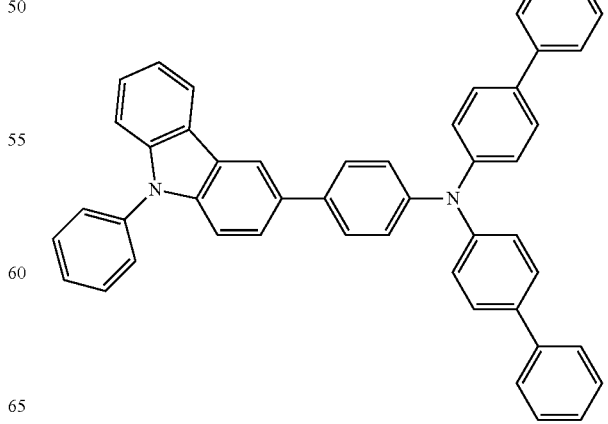

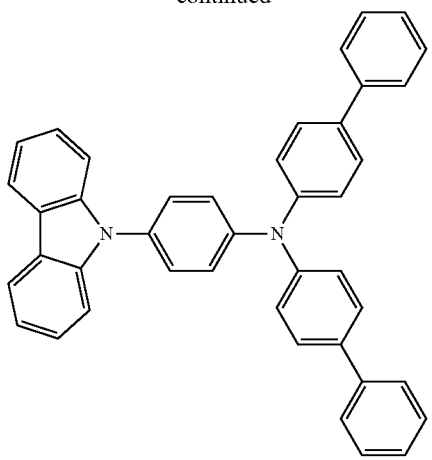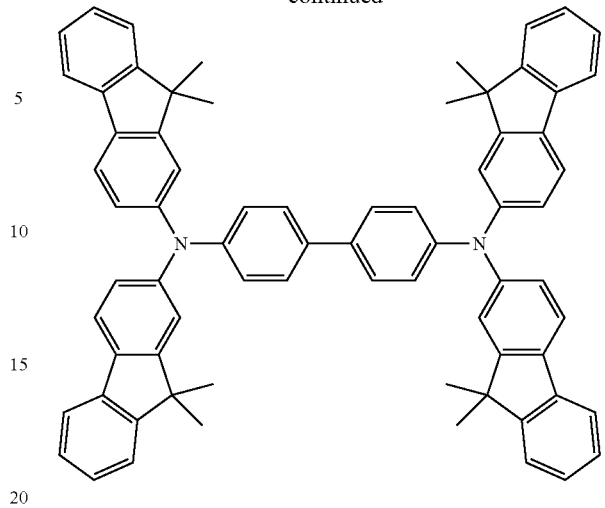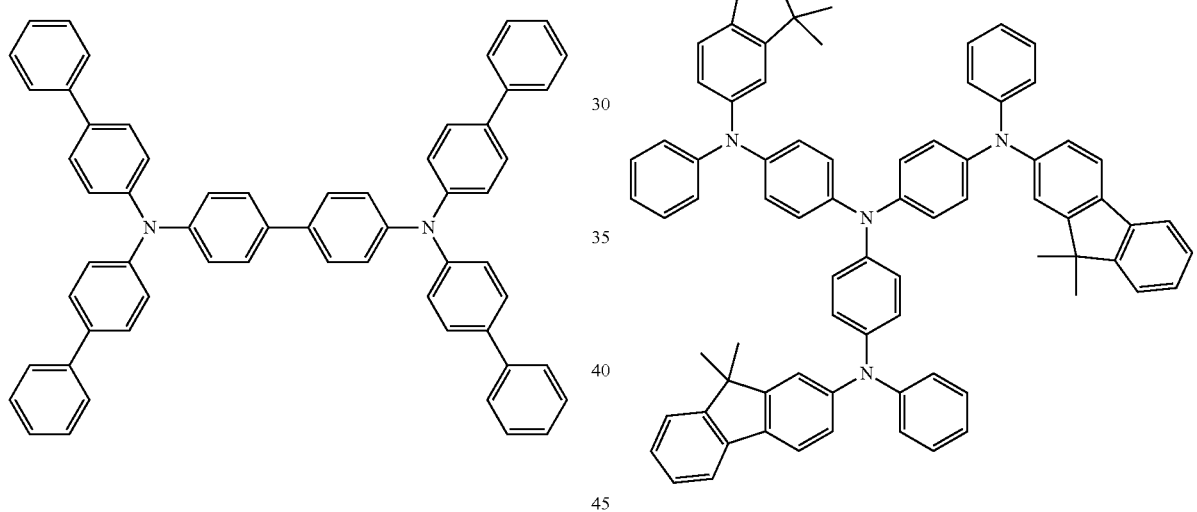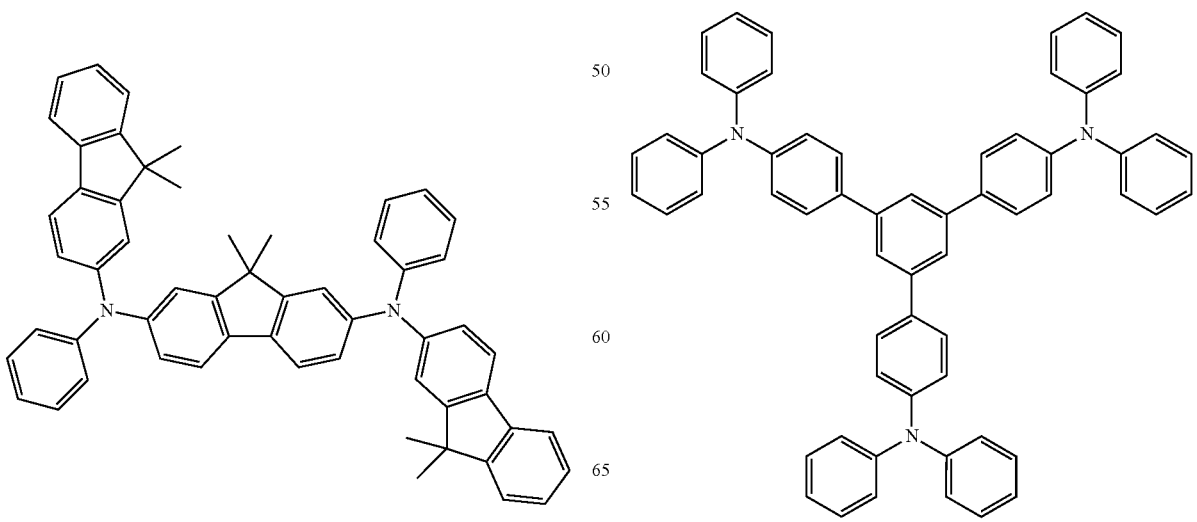

11
-continued
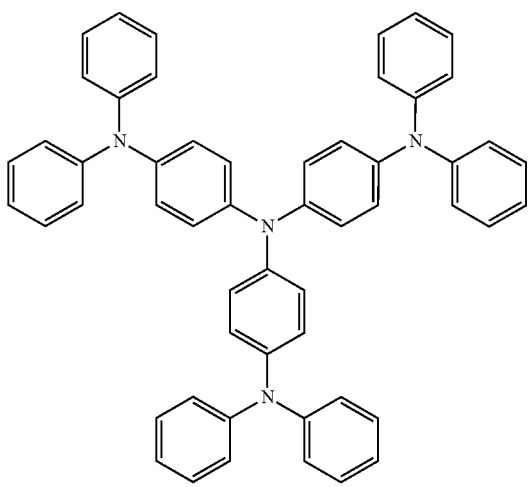
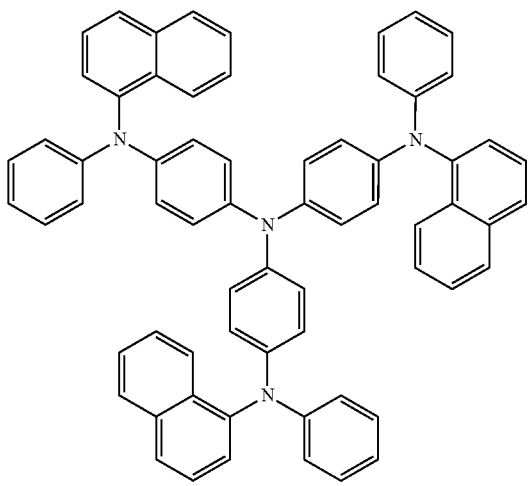
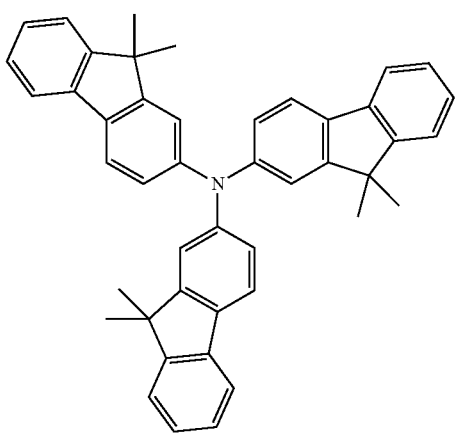
12
-continued
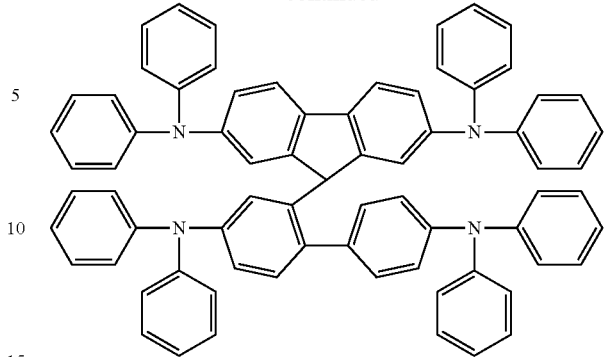
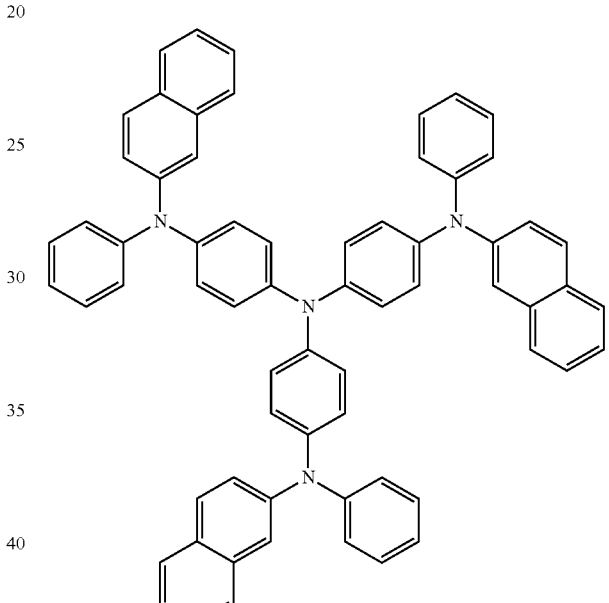
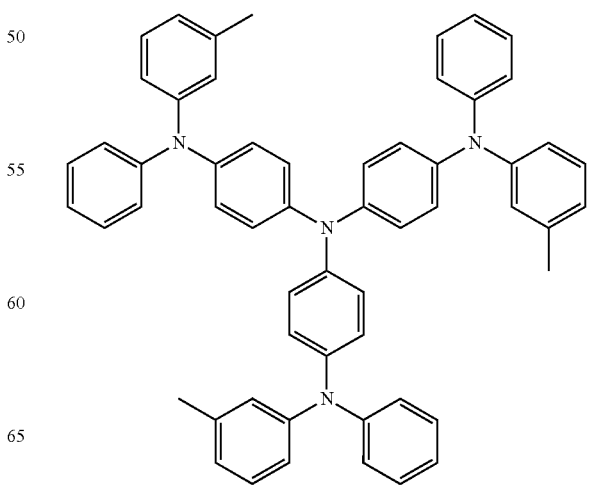

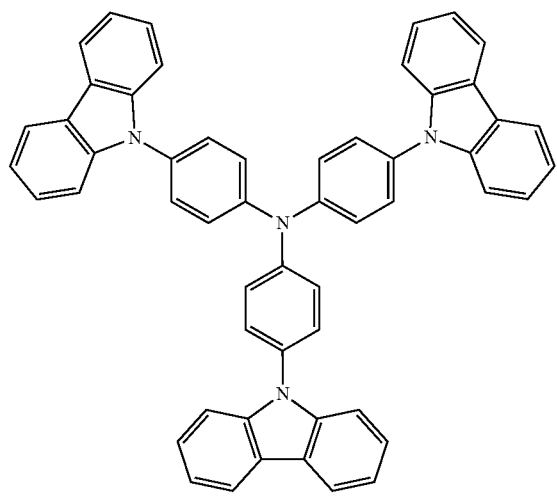
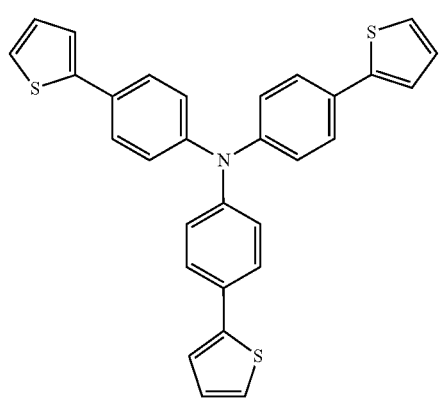
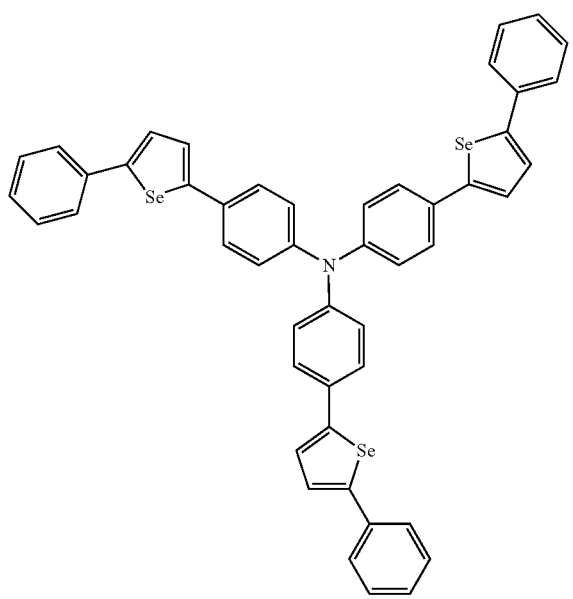
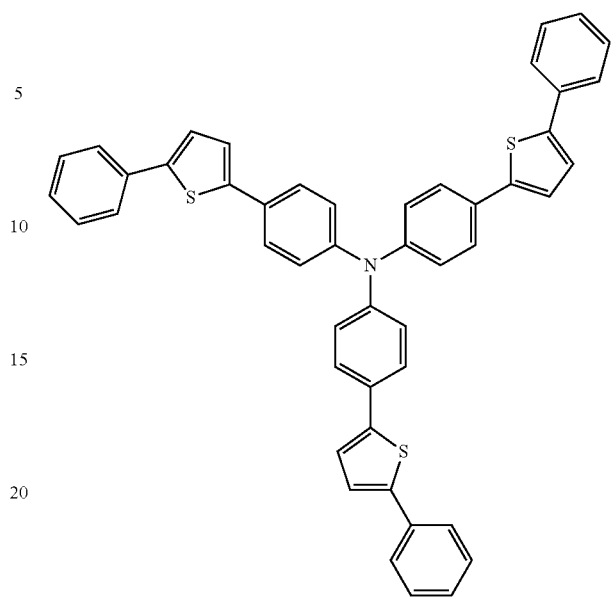

One specific example of the aryl amine compound includes NPB (N,N'-bis(naphthyl)-N,N'-bis(phenyl)benzidine).

An example of the polycyclic condensed ring compound includes a compound of the following Formula 2.

[Formula 2]

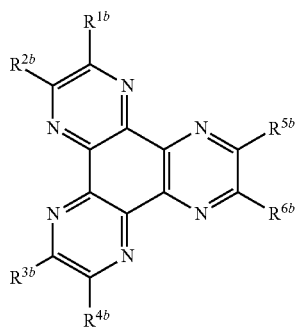

In Formula 2, $R^{1b}$ to $R^{6b}$ may be each hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), a substituted or unsubstituted straight or branched $C_1$ to $C_{12}$ alkoxy, a substituted or unsubstituted straight or branched $C_1$ to $C_{12}$ alkyl, a substituted or unsubstituted straight or branched $C_2$ to $C_{12}$ alkenyl, a substituted or unsubstituted aromatic or non-aromatic heterocyclic ring, a substituted or unsubstituted aryl, a substituted or unsubstituted mono- or di-aryl amine, or a substituted or unsubstituted aralkyl amine, in which R and R' are each a substituted or unsubstituted $C_1$ to $C_{60}$ alkyl, a substituted or unsubstituted aryl, or a substituted or unsubstituted 5- to 7-membered heterocyclic ring.

Examples of Formula 2 include the following Formulas 2-1 to 2-6.

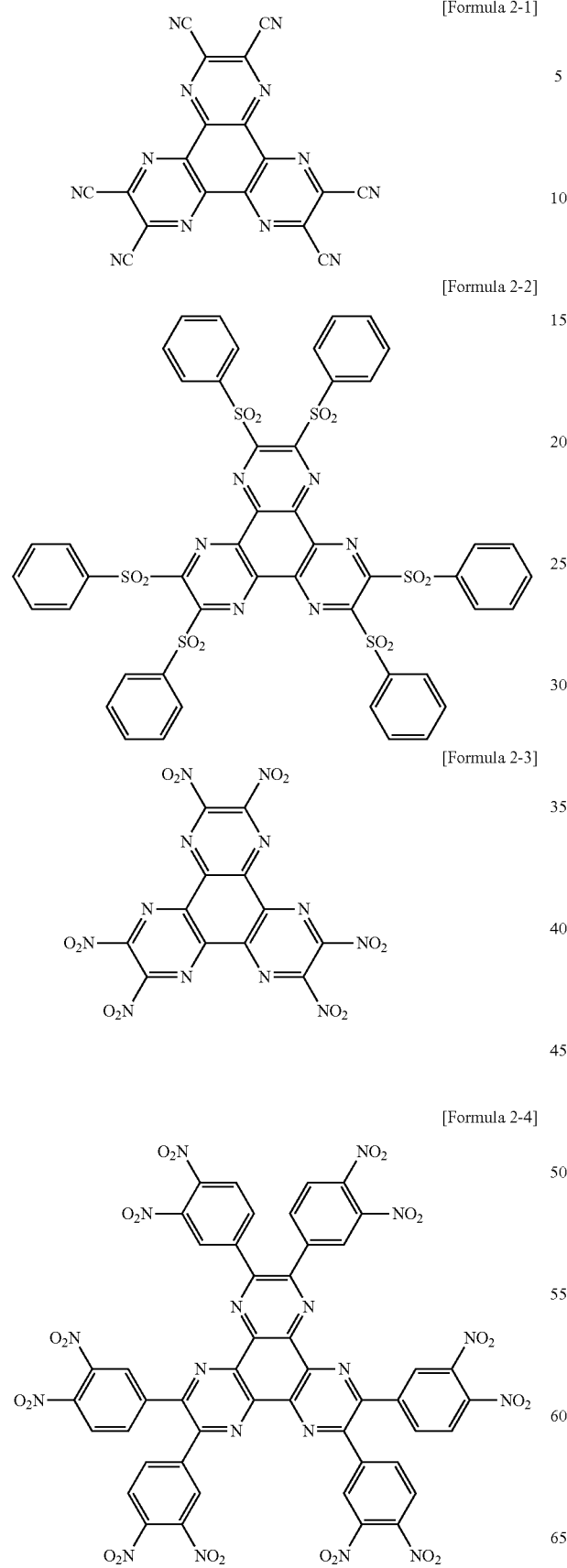

[Formula 2-1]
[Formula 2-2]
[Formula 2-3]
[Formula 2-4]

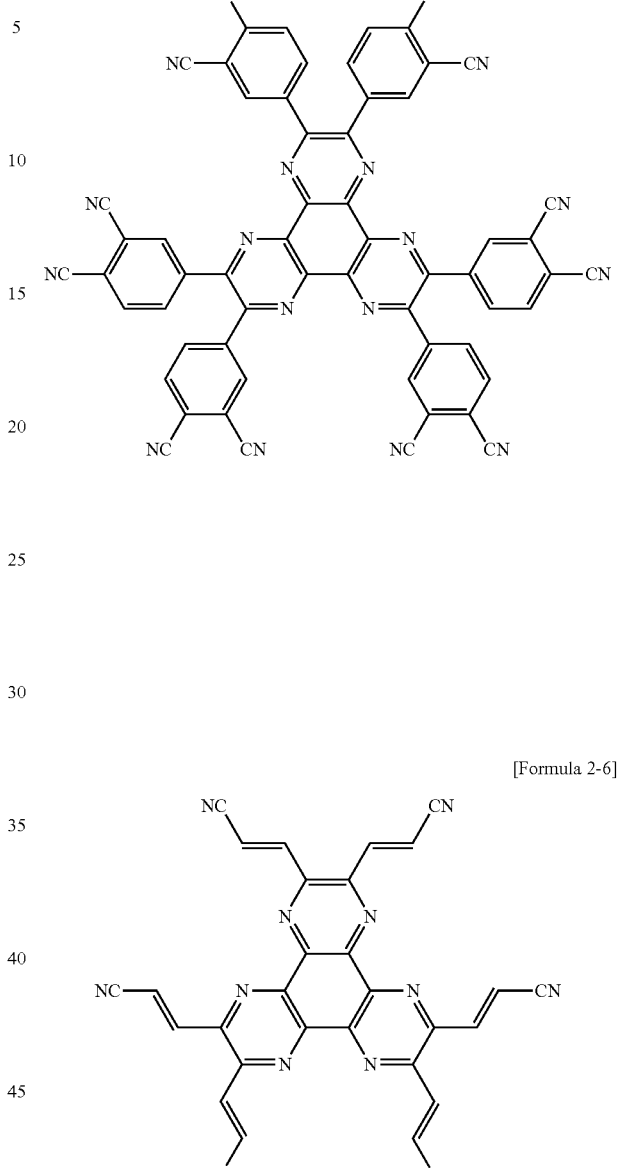

[Formula 2-5]
[Formula 2-6]

In the examples, the weight ratio of the content of the polycyclic condensed compound to the content of the aryl amine compound in the light scattering layer may be in a range from 1/7 to 5/7. Within the range, appropriate roughness may be formed.

As another example, the light scattering layer may include a compound of the following Formula 3. The light scattering layer including a compound of the following Formula 3 may be the first p-type organic material layer, or may be provided between the first p-type organic material layer and the n-type organic material layer. In particular, the compound of the following Formula 3 may be used as a material of FIG. 3 which simultaneously exhibits the effect of the p-type organic material layer and the effect according to the light scattering layer. However, the scope of the present invention is not limited to the following materials.

[Formula 3]

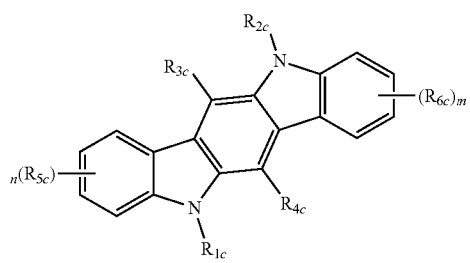

In Formula 3, $R_{1c}$ to $R_{6c}$ may be the same as or different from each other, are each independently a hydrogen atom; a $C_1$ to $C_{30}$ alkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_2$ to $C_{30}$ heterocycloalkyl group, a $C_6$ to $C_{30}$ aryl group, and a $C_2$ to $C_{30}$ heteroaryl group; a $C_3$ to $C_{30}$ cycloalkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; a $C_6$ to $C_{30}$ aryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; or a $C_2$ to $C_{30}$ heteroaryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group, and may form an aliphatic, aromatic, aliphatic hetero, or aromatic hetero condensation ring or a spiro bond in conjunction with an adjacent group, and n and m are each an integer from 0 to 4.

Examples of Formula 3 include the following Formula 3a.

[Formula 3a]

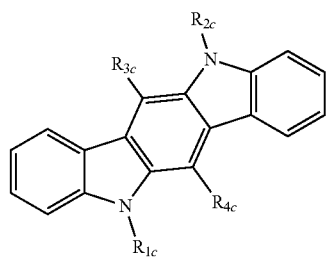

$R_{1c}$ to $R_{4c}$ are the same as described above.

According to an exemplary embodiment, in Formula 3 or 3a, $R_{1c}$ and $R_{2c}$ may be a substituted or unsubstituted straight or branched $C_1$ to $C_{30}$ alkyl group or $C_3$ to $C_{30}$ cyclocalkyl group.

According to another exemplary embodiment, in Formula 3 or 3a, $R_{1c}$ and $R_{2c}$ may be methyl, ethyl, propyl, butyl, or cyclohexyl.

According to an exemplary embodiment, in Formula 3 or 3a, $R_{3c}$ and $R_{4c}$ may be a substituted or unsubstituted monocyclic or polycyclic $C_6$ to $C_{30}$ aryl group.

According to another exemplary embodiment, in Formula 3 or 3a, $R_{3c}$ and $R_{4c}$ may be phenyl or naphthyl.

Examples of Formula 3 include compounds of the following Formulas 3-1 to 3-5.

[Formula 3-1]

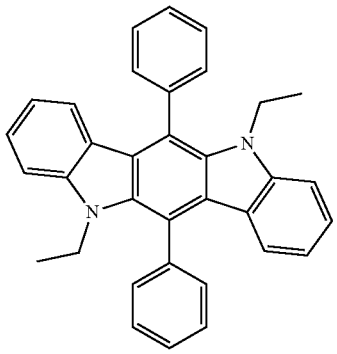

[Formula 3-2]

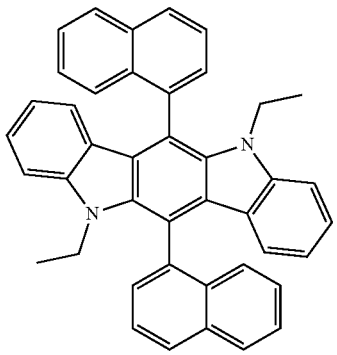

[Formula 3-3]

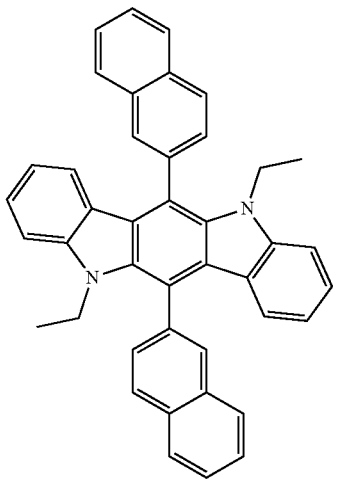

[Formula 3-4]

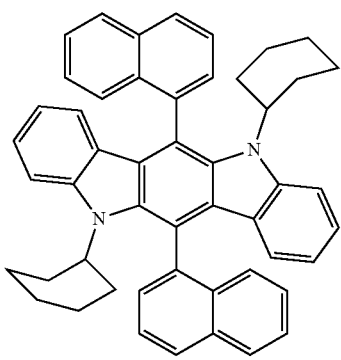

[Formula 3-5]

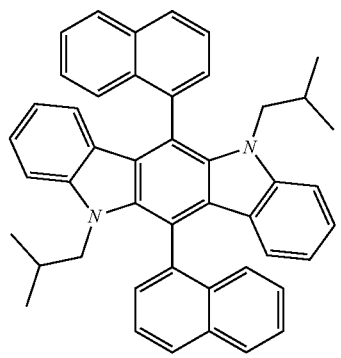

According to an exemplary embodiment, the light scattering layer includes one organic material, which is a p-type organic material. For example, the compound of Formula 3 may be used as a p-type organic material.

According to another exemplary embodiment, the light scattering layer includes two organic materials, in which one of the organic materials is an n-type organic material, and the other one is a p-type organic material. At this time, the n-type organic material may also serve as a p-type dopant for the p-type organic material. For example, the n-type organic material may be the compound of Formula 2, and the p-type organic material may be the compound of Formula 1.

FIGS. 1 to 3 illustrate a structure in which the light emitting layer is in direct contact with the anode. However, an organic material layer may be additionally provided between the light emitting layer and the anode. The organic material layer which may be provided between the light emitting layer and the anode may be a p-type organic material layer. Examples of the p-type organic material layer between the light emitting layer and the anode include a hole injection layer, a hole transporting layer, and the like.

In an exemplary embodiment according to FIG. 2 or FIG. 3, the first p-type organic material layer is disposed as the organic material layer which is associated with the cathode, and the first n-type organic material layer is disposed as the organic material layer provided between the first p-type organic material layer and the light emitting layer. In the present specification, an "organic material layer associated with the cathode" means an organic material layer which is disposed closer to a cathode than an anode based on a light emitting layer. At this time, the organic material layer associated with the cathode may include an organic material layer which is in physical contact with the cathode. However, in the exemplary embodiment, the case where an additional layer is provided between the organic material layer associated with the cathode and the cathode is not completely ruled out.

In general, in an organic electroluminescent device, electrons are injected and transported from a cathode to a light emitting layer, and holes are injected and transported from an anode to the light emitting layer. Accordingly, in the organic electroluminescent device of the related art, an n-type organic material layer, in which electrons are injected or transported through the LUMO energy level, is disposed between the cathode and the light emitting layer.

It is opposite to the technology which has been thought in the field of the organic electroluminescent device that a p-type organic material layer is disposed as the organic material layer associated with the cathode. However, in the exemplary embodiment, the first p-type organic material layer is disposed as the organic material layer associated with the cathode. In addition, in the exemplary embodiment, the first n-type organic material layer is disposed between the first p-type organic material layer and the light emitting layer. Here, an electric charge may be generated between the first p-type organic material layer and the first n-type organic material layer. Among the electric charges generated between the first p-type organic material layer and the first n-type organic material layer, holes move toward the cathode through the HOMO energy level of the first p-type organic material layer. The holes moving through the HOMO energy level of the first p-type organic material layer escape in the direction of the cathode. Furthermore, among the electric charges generated between the first p-type organic material layer and the first n-type organic material layer, electron move toward the light emitting layer through the LUMO energy level of the first n-type organic material layer.

A method of injecting electric charges between the cathode and the organic material layer associated with the cathode will be described in more detail as follows.

The organic electroluminescent device of the related art includes the n-type organic material layer as the organic material layer associated with the cathode. Accordingly, a barrier for injecting electrons from the cathode is a difference between the work function of the cathode and the LUMO energy level of the n-type organic material layer. Accordingly, in the structure of the organic electroluminescent device in the related art, in order to reduce the electron injection barrier, an electron injection layer such as an LiF layer is introduced, an electron transporting layer is doped with an alkali metal or an alkaline earth metal, or a metal having a low work function is used as a cathode material.

However, according to the exemplary embodiment, electric charges are generated between the first p-type organic material layer and the first n-type organic material layer, and holes among the generated electric charges move toward the cathode through the HOMO energy level of the first p-type organic material layer. FIG. 4 illustrates a schematic view of the movement of the electric charge between the cathode and the first p-type organic material layer in the organic electroluminescent device according to the exemplary embodiment, for example, the organic electroluminescent device illustrated in FIG. 2 or 3. According to FIG. 4, a hole transported to the HOMO energy level of the first p-type organic material layer meets an electron of the cathode and is annihilated. Accordingly, the electron injection barrier is not present between the cathode and the first p-type organic material layer. Therefore, in the exemplary embodiment according to the present specification, it is not necessary to make an effort to reduce the electron injection barrier from the cathode to the organic material layer.

Accordingly, in the exemplary embodiment of the present specification, it is possible to select a cathode material from materials having various work functions. Further, it is not necessary to introduce an electron injection layer or dope the organic material layer associated with the cathode with a metal material in order to reduce the electron injection barrier.

Meanwhile, the light emitting characteristic in the organic electroluminescent device is one of the important characteristics of the device. In order to efficiently emit light in the organic electroluminescent device, it is important to achieve a charge balance in a light emitting region. For this purpose, electrons transported from the cathode and holes transported from the anode need to achieve a quantitative balance, and a point at which electrons and holes meet each other to form exitons needs to be within the light emitting region.

Meanwhile, in the organic electroluminescent device, it is possible to use a method of controlling a cavity of the device according to a light emitting color as one of the methods of increasing light emitting efficiency. The light emitting efficiency may be further increased by controlling the cavity of the device so as to be suitable for a wavelength of a light emitting color. Here, the cavity of the device means a length within which light may be resonated in the device. In an example, when an upper electrode is a transparent electrode and a lower electrode is a reflective electrode, the cavity of the device may mean a length from a top of the upper electrode to a top of the lower electrode.

In addition, in the organic electroluminescent device, the distance from the light emitting layer to the cathode may also affect light loss by a surface plasmon, a metal, a waveguide mode, a substrate mode, an out-coupled mode, and the like. Accordingly, it may be necessary to adjust the distance from the light emitting layer to the cathode.

In order to control the distance from the cavity or light emitting layer of the device to the cathode thereof as described above, in the structure of the organic electroluminescent device in the related art, when the thickness of the n-type organic material layer associated with the cathode, for example, the electron transporting layer is increased, an imbalance of the electric charges may be caused. However, in the organic electroluminescent device according to the exemplary embodiment of the present specification, it is possible to control the thickness of the first p-type organic material layer associated with the cathode. That is, controlling the thickness of the first p-type organic material layer may be used to control the distance between the cavity or light emitting device of the device to the cathode thereof. In the exemplary embodiment of the present specification, electrons reaching the light emitting layer are not transported from the cathode, and are generated between the first p-type organic material layer and the first n-type organic material layer. Accordingly, controlling the thickness of the first p-type organic material layer does not affect the charge balance in the light emitting layer. Furthermore, in the exemplary embodiment of the present invention, when the thickness of the first p-type organic material layer is controlled, it is possible to minimize a problem in that a driving voltage is increased according to the increase in thickness of the electron transporting layer which is an n-type organic material layer in a structure of the related art.

In the structure of the related art, when a distance (D) from the cathode to the light emitting layer is controlled, the charge balance in the light emitting layer may be affected. The reason is because the amount of electrons reaching the light emitting layer is varied when the thickness of the n-type organic material layer, for example, the electron injection layer or the electron transporting layer is controlled. FIG. 5 illustrates a structure from the cathode to the light emitting layer in the structure of the organic electroluminescent device as illustrated in FIG. 2 or 3. In the structure as described above, when a thickness Dh of the first p-type organic material layer associated with the cathode is controlled, controlling a distance D from a light emitting point of the light emitting layer to the cathode, as a distance related to the cavity of the device, may be affected, but the charge balance is not affected because a length De related to the amount of electrons is not affected. Here, the light emitting point in the light emitting layer means a point at which light is actually emitted according to the balance of electrons and holes. The light emitting point may be varied depending on the material of the light emitting layer. In the art to which the present invention pertains, a central point of the light emitting layer or the interface between the light emitting layer and another layer may be set as the light emitting point.

For example, when the cathode serves as a reflective plate, the distance D from the light emitting point in the light emitting layer to the cathode may be controlled as an integer-fold of [refractive index of the organic material layer*$\lambda$/4]. At this time, $\lambda$ is a wavelength of light emitted from the light emitting layer. Since lights having different colors have different wavelengths, it is possible to differently control the distance D from the light emitting point in the light emitting layer to the cathode depending on the color of light emitting from the light emitting layer. Further, it is possible to differently control the distance D from the light emitting point in the light emitting layer to the cathode depending on the refractive index of the organic material layer. At this time, when the organic material layer is composed of two or more layers, the refractive index of the organic material layer may be calculated by obtaining the refractive index of each layer and then obtaining the sum thereof.

In addition, when light proceeding toward the cathode reaches the surface of the cathode and is reflected, the penetration depth of light is varied depending on the type of cathode material. Accordingly, the type of cathode material causes a change in phase of light reflected from the surface of the cathode. At this time, in consideration of the phase difference to be changed, it is necessary to control the distance D from the light emitting point in the light emitting layer to the cathode. Accordingly, a material of the cathode may also affect the distance from the light emitting layer to the cathode.

When a phase matching of light proceeding from the light emitting layer to the cathode and light reflected from the cathode occurs, a constructive interference occurs, and thus it is possible to implement bright light, and conversely, when a phase mismatching between the lights occurs, a destructive interference occurs, and thus a part of the light is annihilated. According to the phenomenon of the phase matching and the phase mismatching as described above, the brightness of the emitting light is shown in the form of a sine curve depending on the distance from the light emitting layer to the cathode.

According to an exemplary embodiment of the present specification, in the sine curve showing the brightness of the emitting light of the device according to the distance from the light emitting layer to the cathode, a value of an x-axis at a point where the brightness of light is maximum may be set as the distance from the light emitting layer to the cathode.

According to an exemplary embodiment of the present specification, a distance from a boundary between the first p-type organic material layer and the first n-type organic material layer or from a boundary between the light scattering layer and the first n-type organic material layer to the light emitting layer and a distance from the anode to the light emitting layer may be controlled such that an amount of holes in the light emitting layer is balanced with that of electrons therein. Here, the balance between the amount of holes and the amount of electrons means that the holes and electrons injected into the light emitting layer are recombined with each other in the light emitting layer and thus effectively form excitons for light emission, and the loss of holes and electrons involved in forming the excitons is minimized. For example, when the amount of holes in the device is larger than the amount of electrons therein, holes, which do not emit light and are annihilated, are generated in addition to holes involved in excitons due to excessive holes, thereby causing a loss of the quantum efficiency in the device. Conversely, when the amount of electrons is larger than the amount of holes, the loss of electrons may be caused. Accordingly, an attempt has been made to reduce the amounts of holes and electrons, which are annihilated without contributing to light emission, by achieving a quantitative balance of injected holes and electrons.

For example, as means for achieving a quantitative balance between holes and electrons in the light emitting layer, it is also important to control a movement velocity of holes and electrons. When holes are excessively present in the light emitting layer, a balance between holes and electrons may be achieved in the light emitting layer by increasing an injection velocity of electrons. In general, the hole mobility of a material provided between the anode and the light emitting layer, that is, in a second electric charge transporting passage and transporting holes is faster than the electron mobility of a material provided between the cathode and the light emitting layer, that is, in a first electric charge transporting passage and transporting electrons. For example, the hole mobility of NPB is at the level of $8.8 \times 10^{-4}$ cm$^2$/Vs, whereas the electron mobility of Alq3 is at the level of $6.7 \times 10^{-5}$ cm$^2$/Vs.

Accordingly, in enhancing the light emission efficiency of the device, it is important to enhance the electron mobility, and in increasing and using the distance from the cathode to the light emitting layer, it may be effective to increase the thickness of the first p-type organic material layer rather than the thickness of the first n-type organic material layer.

Therefore, according to an example, the distance from a boundary between the first p-type organic material layer and the first n-type organic material layer or from a boundary between the light scattering layer and the first n-type organic material layer to the light emitting layer may be configured to be shorter than the distance from the anode to the light emitting layer. As a specific example, the distance from the boundary between the first p-type organic material layer and the first n-type organic material layer or from the boundary between the light scattering layer and the first n-type organic material layer to the light emitting layer may be configured to be from 100 Å to 500 Å. As another specific example, the distance from the anode to the light emitting layer may be configured to be from 500 Å to 5,000 Å. However, the specific value may be controlled differently according to the characteristics of the light emitting layer or the user.

According to an exemplary embodiment of the present specification, it is possible to control the thickness of the first p-type organic material layer for stability of the device. When the thickness of the first p-type organic material layer is controlled to be increased, the stability of the device may be further improved without affecting a charge balance in the device or an increase in voltage.

Here, the stability of the device means a degree which may prevent a short phenomenon due to contact between the anode with the cathode, which may occur when the device is thin. In general, when the thickness of the n-type organic material layer provided between the cathode and the light emitting layer is controlled to be increased, stability of the device may be improved, but driving voltage thereof is rapidly increased, thereby reducing the power efficiency thereof. In order to solve the problem in the related art, an attempt has been made to control the thickness of the n-type organic material layer provided between the cathode and the light emitting layer to be increased and dope the organic material layer with a metal, but there is a problem in that an increase in light absorption efficiency and a reduction in service life occur, and the process thereof becomes complicated.

However, according to the description of the present specification, it is possible to increase the distance between the light emitting layer and the cathode by controlling the thickness of the first p-type organic material layer, which does not affect the charge balance or the increase in voltage, instead of controlling the thickness of the n-type organic material layer provided in the cathode and the light emitting layer. Accordingly, stability of the device is improved, and the increase in driving voltage is minimized, thereby increasing the power efficiency.

According to an example, in consideration of stability of the device, the distance from the cathode to the light emitting layer may be configured to be longer than the distance from the anode to the light emitting layer. Even in such a configuration, the charge balance or the increase in voltage is not affected unlike the related art. In a specific example, the thickness of the first p-type organic material layer may be controlled to be 5 nm or more, and as the first p-type organic material layer becomes thick, the stability of the device may be enhanced. The upper limit of the thickness of the first p-type organic material layer is not particularly limited, and may be determined by those skilled in the art. For example, in consideration of ease of process, the thickness of the first p-type organic material layer may be selected from 500 nm or less.

According to another exemplary embodiment of the present specification, the thickness of the first p-type organic material layer may be controlled such that the cavity length of the organic electroluminescent device is an integer-fold of the wavelength of light emitted from the light emitting layer. It is possible to improve light emission efficiency caused by constructive interference of light by controlling the cavity length of the organic electroluminescent device to be an integer-fold of the wavelength of light as described above.

According to still another exemplary embodiment of the present specification, it is possible to control the distance from the boundary between the first p-type organic material layer and the first n-type organic material layer or from the boundary between the light scattering layer and the first n-type organic material layer to the light emitting layer and the distance from the anode to the light emitting layer such that the amount of holes in the light emitting layer is balanced with the amount of electrons therein, and to control the thickness of the first p-type organic material layer such that the cavity length of the organic electroluminescent device is an integer-fold of the wavelength of light emitted from the light emitting layer.

According to yet another exemplary embodiment of the present specification, it is possible to control a moving time of electrons from the boundary between the first p-type organic material layer and the first n-type organic material layer or from the boundary between the light scattering layer and the first n-type organic material layer to the light emitting layer and a moving time of holes from the anode to the light emitting layer such that the holes and the electrons of the device are quantitatively balanced in the light emitting layer, and to control the thickness of the first p-type organic material layer such that the cavity length of the organic electroluminescent device is an integer-fold of the wavelength of light emitted from the light emitting layer.

According to still yet another embodiment of the present specification, a difference between the HOMO energy level of the first p-type organic material layer and the LUMO energy level of the first n-type organic material layer is 2 eV or less. According to an exemplary embodiment of the present specification, the difference between the HOMO energy level of the first p-type organic material layer and the LUMO energy level of the first n-type organic material layer may be more than 0 eV and 2 eV or less, or more than 0 eV and 0.5 eV or less. According to another exemplary embodiment of the present specification, a material for the first p-type organic material layer and the first n-type organic material layer may be selected such that the difference between the HOMO energy level of the first p-type organic material layer and the LUMO energy level of the first n-type organic material layer is from 0.01 eV to 2 eV.

In the case where the energy difference between the HOMO energy level of the first p-type organic material layer and the LUMO energy level of the first n-type organic material layer is 2 eV or less, when the first p-type organic material layer and the first n-type organic material layer are in contact with each other, an NP junction may be easily generated therebetween. In this case, a driving voltage for injecting electrons may be reduced.

The first p-type organic material layer and the first n-type organic material layer may be in contact with each other. In this case, an NP junction is formed between the first p-type organic material layer and the first n-type organic material layer. When the NP junction is formed, the difference between the HOMO energy level of the first p-type organic material layer and the LUMO energy level of the first n-type organic material layer is reduced. Accordingly, when an external voltage is applied thereto, holes and electrons are easily formed from the NP junction.

According to an exemplary embodiment of the present specification, the first p-type organic material layer is "non-doped". When the first p-type organic material layer is non-doped, unexpected absorption of visible light may be prevented by forming a charge transfer complex between the dopant and the host, thereby preventing light emission efficiency from being reduced. When the first p-type organic material layer is non-doped, the first p-type organic material layer is differentiated from a layer having p-type semiconductor characteristics by doping the organic material in the related art with a p-type dopant. The first p-type organic material layer does not exhibit p-type semiconductor characteristics by the p-type dopant, but includes an organic material having p-type semiconductor characteristics. In the case of the organic material having p-type semiconductor characteristics, two or more organic materials may also be included in the first p-type organic material layer.

According to an exemplary embodiment of the present specification, the work function of the cathode may have a value equal to or less than the HOMO energy level of the first p-type organic material layer.

When the work function of the cathode has a value equal to or less than the HOMO energy level of the first p-type organic material layer, an injection barrier is not present when electrons are injected from the cathode to the HOMO energy level of the first p-type organic material layer.

According to an exemplary embodiment of the present specification, a difference between the HOMO energy level of the first p-type organic material layer and the LUMO energy level of the first n-type organic material layer may be 2 eV or less. According to another exemplary embodiment of the present specification, the difference between the HOMO energy level of the first p-type organic material layer and the LUMO energy level of the first n-type organic material layer may be more than 0 eV and 2 eV or less, or more than 0 eV and 0.5 eV or less. According to still another exemplary embodiment of the present specification, a material for the first p-type organic material layer and the first n-type organic material layer may be selected such that the difference between the HOMO energy level of the first p-type organic material layer and the LUMO energy level of the first n-type organic material layer is from 0.01 eV to 2 eV.

In the case where the energy difference between the HOMO energy level of the first p-type organic material layer and the LUMO energy level of the first n-type organic material layer is 2 eV or less, when the first p-type organic material layer and the first n-type organic material layer are in contact with each other, an NP junction may be easily generated therebetween. In this case, a driving voltage for injecting electrons may be reduced.

The cathode and the first p-type organic material layer may be in contact with each other. When the cathode and the first p-type organic material layer are in contact with each other and the work function of the cathode is equal to or greater than the HOMO energy level of the first p-type organic material layer, electrons are easily injected from the cathode to the HOMO energy level of the first p-type organic material layer even though the difference between the work function of the cathode and the HOMO energy level of the first p-type organic material layer is large. This is because holes produced from the NP junction between the first p-type organic material layer and the first n-type organic material layer move along the first p-type organic material layer toward the cathode. In general, when electrons move from the low energy level to the high energy level, there is no barrier. Further, when holes move from the high energy level to the low energy level, no barrier is produced. Accordingly, electrons may move from the cathode to the HOMO energy level of the first p-type organic material layer without an energy barrier.

An additional layer may be additionally provided between the cathode and the first p-type organic material layer. In this case, the HOMO energy level of the additional layer may be equal to the work function of the cathode or the HOMO energy level of the first p-type organic material layer, or may be between the work function of the cathode or the HOMO energy level of the first p-type organic material layer.

The first p-type organic material layer and the first n-type organic material layer may be in contact with each other. In this case, an NP junction is formed between the first p-type organic material layer and the first n-type organic material layer. When the NP junction is formed, the difference between the HOMO energy level of the first p-type organic material layer and the LUMO energy level of the first n-type organic material layer is reduced. Accordingly, when an external voltage is applied thereto, holes and electrons are easily formed from the NP junction.

As a material for the first p-type organic material layer, it is possible to use an organic material having p-type semiconductor characteristics. For example, an aryl amine compound may be used. As an example of the aryl amine compound, there is a compound of the following Formula 1.

The first n-type organic material layer is not limited to be composed of a single material, and may be composed of one or two or more compounds having n-type semiconductor characteristics. In addition, the first n-type organic material layer may be composed of a single layer, but may also include two or three or more layers. At this time, the two or more layers may be composed of the same material, but may be composed of different materials. If necessary, at least one layer of the layers constituting the first n-type organic material layer may be doped with an n-type dopant.

The first n-type organic material layer is not particularly limited as long as the organic material layer is composed of a material which may move electric charges through the LUMO energy level between the first p-type organic material layer and the light emitting layer, as described above. For example, a compound of the following Formula 2 may be used.

Other examples, or synthesis methods and various characteristics of Formula 2 are described in US Patent Application No. 2002-0158242, and U.S. Pat. Nos. 6,436,559 and 4,780,536, and the contents of these documents are all incorporated in the present specification.

Furthermore, the first n-type organic material layer may include one or more compounds selected from 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted 3,4,9,10-perylenetetracarboxylic dianhydride (PTCDA), naphthalene tetracaboxylic dianhydride (NTCDA), fluoro-substituted naphthalene tetracaboxylic dianhydride (NTCDA), and cyano-substituted naphthalene tetracaboxylic dianhydride (NTCDA).

Moreover, as a material for the first n-type organic material layer, it is possible to use an organic material having n-type semiconductor characteristics used as an electron injection or transporting material, which is known in the art. Specifically, the following material may be used, but the present invention is not limited thereto. For example, as an example of the material for the first n-type organic material layer, it is possible to use a compound having a functional group selected from an imidazole group, an oxazole group, a thiazole group, a quinoline group, and a phenanthroline group.

Specific examples of the compound having a functional group selected from an imidazole group, an oxazole group, and a thiazole group include a compound of the following Formula 4 or 5.

[Formula 4]

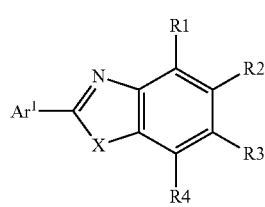

In Formula 4, $R^1$ and $R^4$ may be the same as or different from each other, are each independently a hydrogen atom; a $C_1$ to $C_{30}$ alkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; a $C_3$ to $C_{30}$ cycloalkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; a $C_5$ to $C_{30}$ aryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; or a $C_2$ to $C_{30}$ heteroaryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group, and may form an aliphatic, aromatic, aliphatic hetero, or aromatic hetero condensation ring or a spiro bond in conjunction with an adjacent group; $Ar^1$ is a hydrogen atom, a substituted or unsubstituted aromatic ring, or a substituted or unsubstituted aromatic heterocyclic ring; X is O, S, or $NR^a$; and $R^a$ may be hydrogen, a $C_1$ to $C_7$ aliphatic hydrocarbon, an aromatic ring, or an aromatic heterocyclic ring.

[Formula 5]

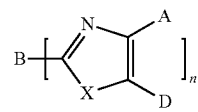

In Formula 5, X is O, S, $NR^b$, or a $C_1$ to $C_7$ divalent hydrocarbon group; A, D, and $R^b$ are each hydrogen, a nitrile group (—CN), a nitro group (—NO$_2$), a $C_1$ to $C_{24}$ alkyl, a substituted aromatic ring including a $C_5$ to $C_{20}$ aromatic ring or a hetero atom, a halogen, or an alkylene or an alkylene including a hetero atom that may form a fused ring in conjunction with an adjacent ring; A and D may be connected to each other to form an aromatic or hetero aromatic ring; B is a substituted or unsubstituted alkylene or arylene which conjugately or unconjugately connects multiple heterocyclic rings as a linkage unit when n is 2 or more, and a substituted or unsubstituted alkyl or aryl when n is 1; and n is an integer from 1 to 8.

Examples of the compound of Formula 4 include compounds known in Korean Patent Application Laid-Open No. 2003-006773, and examples of the compound of Formula 4 include compounds described in U.S. Pat. No. 5,645,948 and compounds described in WO05/097756. All the contents of the documents are incorporated in the present specification.

Specifically, the compound of Formula 4 also includes the compound of Formula 6.

[Formula 6]

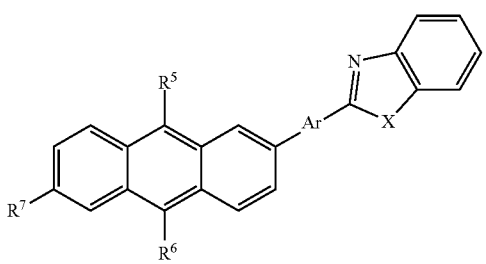

Further, the compound of Formula 5 also includes the following compound of Formula 7.

[Formula 7]

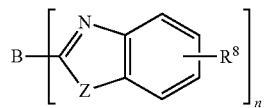

In Formula 6, $R^5$ to $R^7$ are the same as or different from each other, and are each independently a hydrogen atom, a $C_1$ to $C_{20}$ aliphatic hydrocarbon, an aromatic ring, an aromatic heterocyclic ring, or an aliphatic or aromatic fused ring; Ar is a direct bond, an aromatic ring or an aromatic heterocyclic ring; X is O, S, or $NR^a$; $R^a$ is a hydrogen atom, a $C_1$ to $C_7$ aliphatic hydrocarbon, an aromatic ring, or an aromatic heterocyclic ring; and however, the case where $R^5$ and $R^6$ are simultaneously hydrogen is ruled out.

In Formula 7, Z is O, S, or $NR^b$; $R^8$ and $R^b$ are a hydrogen atom, a $C_1$ to $C_{24}$ alkyl, a substituted aromatic ring including a $C_5$ to $C_{20}$ aromatic ring or a hetero atom, a halogen, or an alkylene or an alkylene including a hetero atom which may form a fused ring in conjunction with a benzazole ring; B is alkylene, arylene, a substituted alkylene, or a substituted arylene which conjugately or unconjugately connects multiple benzazoles as a linkage unit when n is 2 or more, and a substituted or unsubstituted alkyl or aryl when n is 1; and n is an integer from 1 to 8.

For example, imidazole compounds having the following structures may be used:

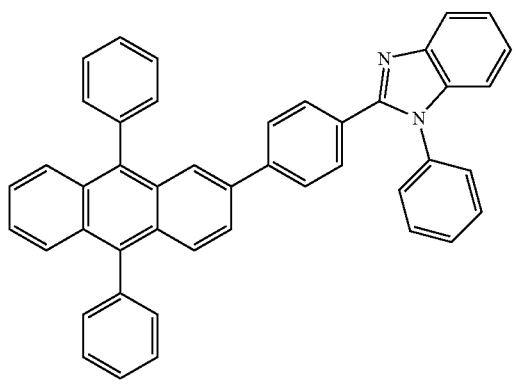

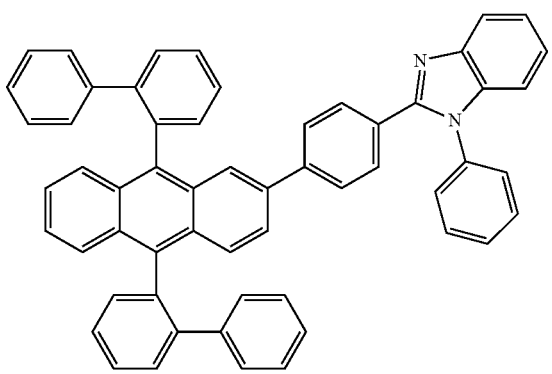

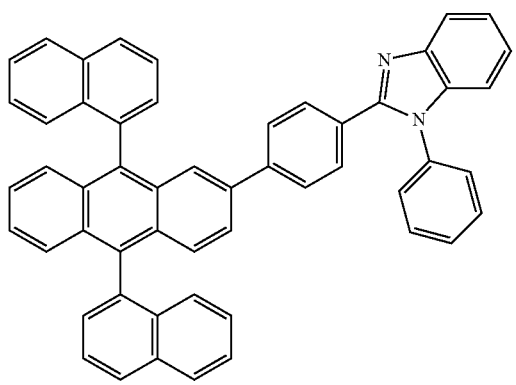

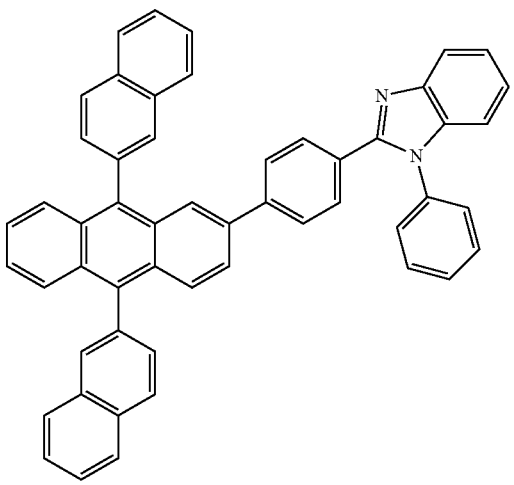

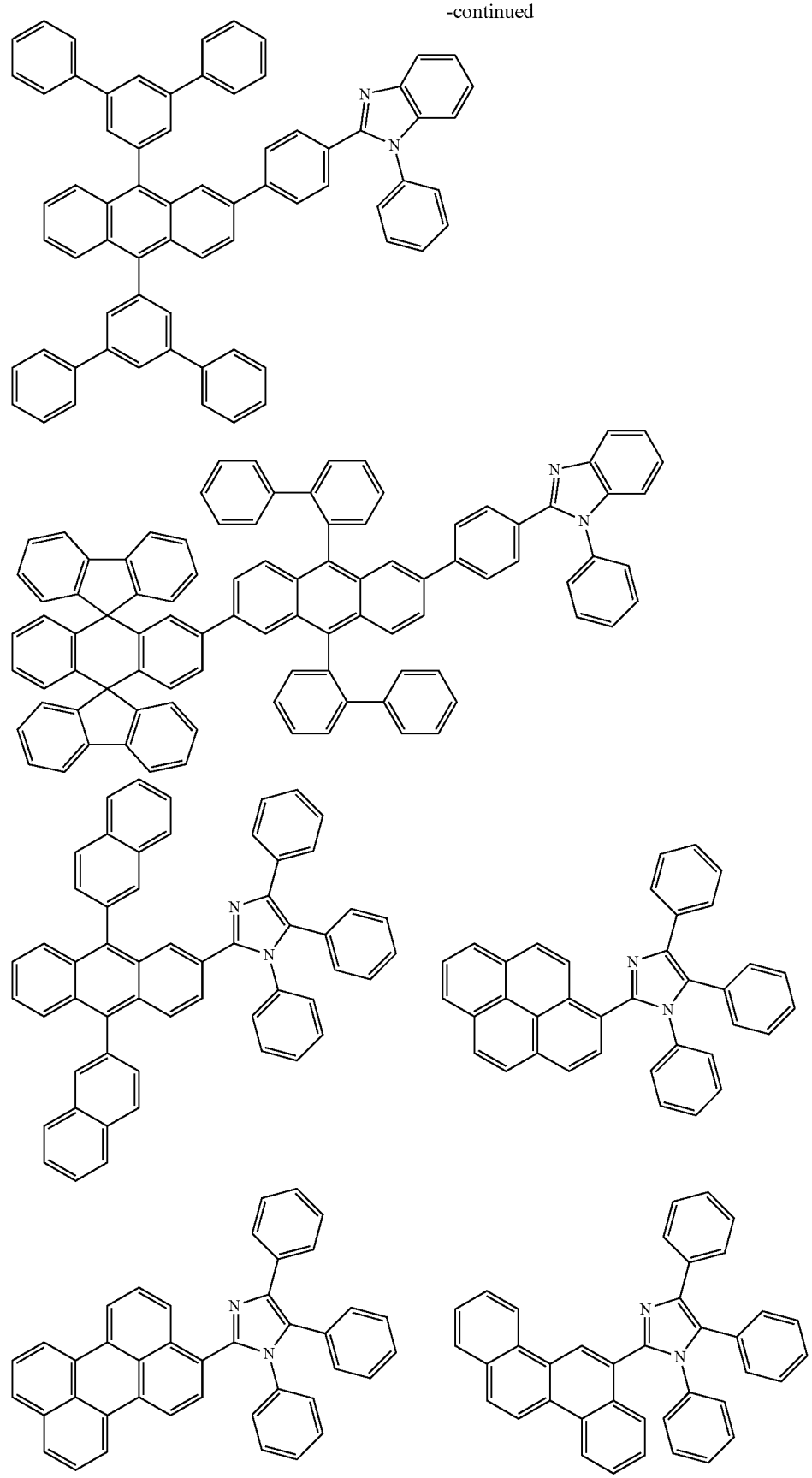

Examples of the compound having a quinoline group include the following compounds of Formulas 8 to 14.

[Formula 8]

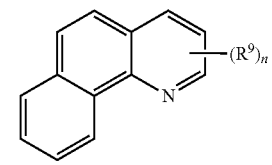

[Formula 9]

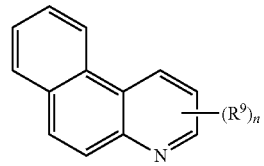

[Formula 10]

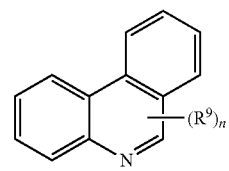

[Formula 11]

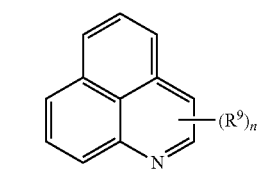

[Formula 12]

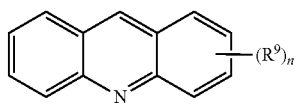

[Formula 13]

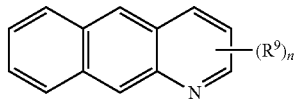

[Formula 14]

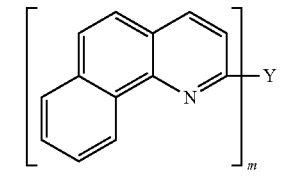

In Formulas 8 to 14, n is an integer from 0 to 9, m is an integer of 2 or more, $R^9$ is selected from a ring structure with hydrogen, an alkyl group such a methyl group and an ethyl group, a cycloalkyl group such as cyclohexyl and norbornyl, an aralkyl group such as a benzyl group, an alkenyl group such as a vinyl group and an allyl group, a cycloalkenyl group such a cyclopentadienyl group and a cyclohexenyl group, an alkoxy group such as a methoxy group, an alkylthio group in which an oxygen atom with an ether bond of an alkoxy group is substituted with a sulfur atom, an aryl ether group such as a phenoxy group, an aryl thioether group in which an oxygen atom with an ether bond of an aryl ether group is substituted with a sulfur atom, an aryl group such as a phenyl group, a naphthyl group, and a biphenyl group, a heterocyclic group such as a furyl group, a thienyl group, an oxazolyl group, a pryridyl group, a quinolyl group, and a carbazolyl group, a halogen, a cyano group, an aldehyde group, a carbonyl group, a carboxyl group, an ester group, a carbamoyl group, an amino group, a nitro group, a silyl group such as a trimethylsilyl group, a siloxanyl group which is a group having silicon through an ether bond, and an adjacent substituent; and the substituents may be unsubstituted or substituted, and may be the same as or different from each other when n is 2 or more; and Y is a divalent group of groups of $R^9$.

The compounds of Formulas 8 to 14 are described in Korean Patent Application Laid-Open No. 2007-0118711, and the contents of the documents are all incorporated in the present specification by reference.

Examples of the compound having a phenanthroline group include the following compounds of Formulas 15 to 25, but are not limited thereto.

[Formula 15]

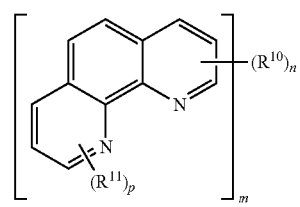

[Formula 16]

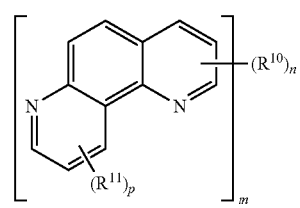

[Formula 17]

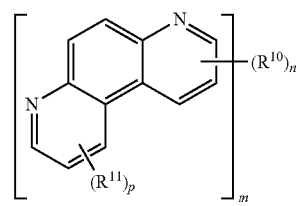

[Formula 18]

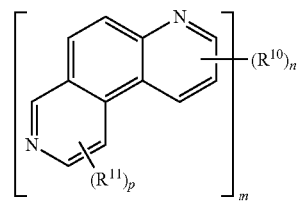

In Formulas 15 to 18, m is an integer of 1 or more, n and p are an integer, n+p is 8 or less, when m is 1, $R^{10}$ and $R^{11}$ are selected from a ring structure with hydrogen, an alkyl group such a methyl group and an ethyl group, a cycloalkyl group such as cyclohexyl and norbornyl, an aralkyl group such as a benzyl group, an alkenyl group such as a vinyl group and an allyl group, a cycloalkenyl group such a cyclopentadienyl group and a cyclohexenyl group, an alkoxy group such as a methoxy group, an alkylthio group in which an oxygen atom with an ether bond of an alkoxy group is substituted with a sulfur atom, an aryl ether group such as a phenoxy group, an aryl thioether group in which an oxygen atom with an ether bond of an aryl ether group is substituted with a sulfur atom, an aryl group such as a phenyl group, a naphthyl group, and a biphenyl group, a heterocyclic group such as a furyl group, a thienyl group, an oxazolyl group, a pryridyl group, a quinolyl group, and a carbazolyl group, a halogen, a cyano group, an aldehyde group, a carbonyl group, a carboxyl group, an ester group, a carbamoyl group, an amino group, a nitro group, a silyl group such as a trimethylsilyl group, a siloxanyl group which is a group having silicon through an ether bond, and an adjacent substituent;

when m is 2 or more, $R^{10}$ is a direct bond or a divalent or more group of the above-described groups, and $R^{11}$ is the same as the case where m is 1, and the substituents may be unsubstituted or substituted, and when n or p is 2 or more, the substituents may be the same as or different from each other.

The compounds of Formulas 15 to 18 are described in Korean Patent Application Laid-Open Nos. 2007-0052764 and 2007-0118711, and the contents of the documents are all incorporated in the present specification by reference.

[Formula 19]

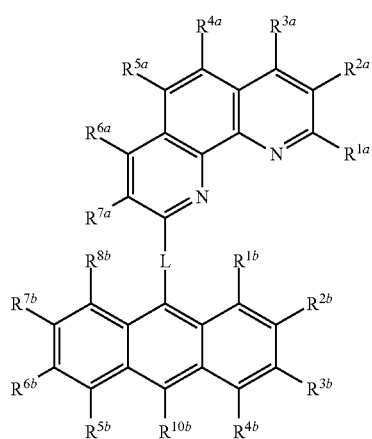

[Formula 20]

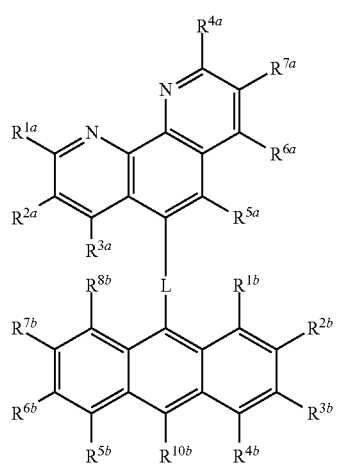

[Formula 21]

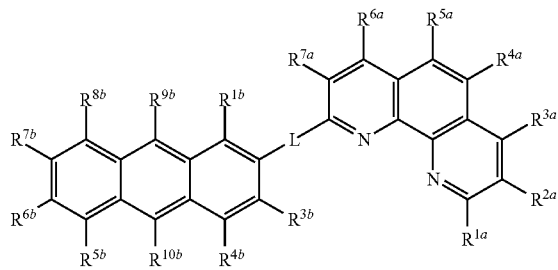

[Formula 22]

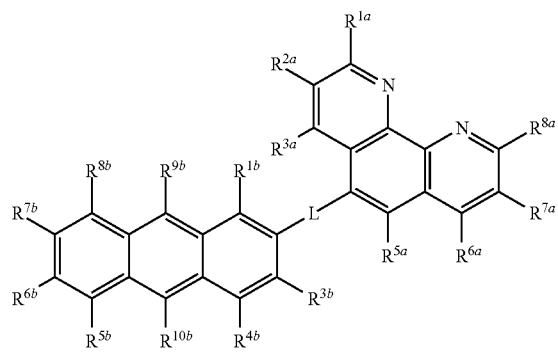

In Formulas 19 to 22, $R^{1a}$ to $R^{8a}$ and $R^{1b}$ to $R^{10b}$ are each a hydrogen atom, a substituted or unsubstituted aryl group having from 5 to 60 nucleus atoms, a substituted or unsubstituted pyridyl group, a substituted or unsubstituted quinolyl group, a substituted or unsubstituted alkyl group having from 1 to 50 carbon atoms, a substituted or unsubstituted cycloalkyl group having from 3 to 50 carbon atoms, a substituted or unsubstituted aralkyl group having from 6 to 50 nucleus atoms, a substituted or unsubstituted alkoxy group having from 1 to 50 carbon atoms, a substituted or unsubstituted aryloxy group having from 5 to 50 nucleus atoms, a substituted or unsubstituted arylthio group having from 5 to 50 nucleus atoms, a substituted or unsubstituted alkoxycarbonyl group having from 1 to 50 carbon atoms, an amino group substituted with a substituted or unsubstituted aryl group having from 5 to 50 nucleus atoms, a halogen atom, a cyano group, a nitro group, a hydroxyl group, or a carboxyl group, and may be bonded to each other to from an aromatic ring, and L is a substituted or unsubstituted arylene group having from 6 to 60 carbon atoms, a substituted or unsubstituted pyridinylene group, a substituted or unsubstituted quinolynylene group, or a substituted or unsubstituted fluorenylene group. The compounds of Formulas 19 to 22 are described in Japanese Patent Application Laid-Open No. 2007-39405, and the content of the document is all incorporated in the present specification by reference.

[Formula 23]

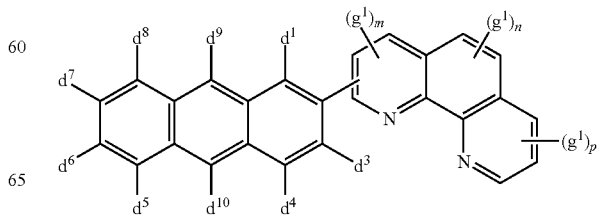

-continued

[Formula 24]

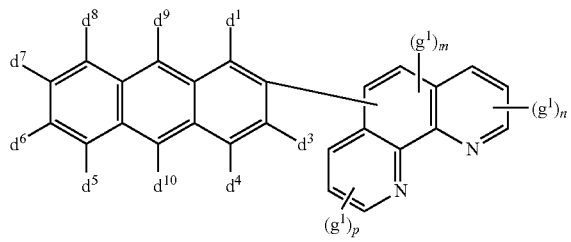

In Formulas 23 and 24, $d^1$, $d^3$ to $d^{10}$, and $g^1$ are each hydrogen, or an aromatic or aliphatic hydrocarbon group, m and n are an integer from 0 to 2, and p is an integer from 0 to 3. The compounds of Formulas 23 and 24 are described in US Patent Publication No. 2007/0122656, and the content of the document is all incorporated in the present specification by reference.

[Formula 25]

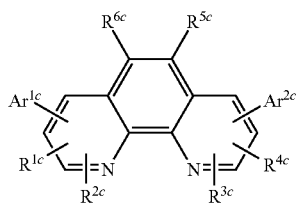

In Formula 25, $R^{1c}$ to $R^{6c}$ are each a hydrogen atom, a substituted or unsubstituted alkyl group, a substituted or unsubstituted aralkyl group, a substituted or unsubstituted aryl group, a substituted or unsubstituted heterocyclic group, or a halogen atom, and $Ar^{1c}$ are $Ar^{2c}$ are each selected from the following structural formulas.

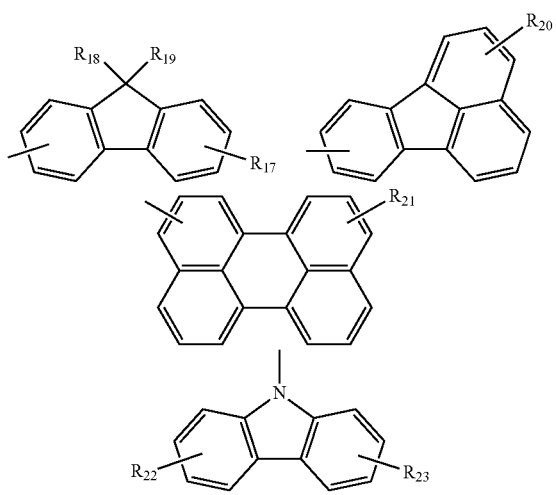

In the structural formulas, $R_{17}$ to $R_{23}$ are each a hydrogen atom, a substituted or unsubstituted alkyl group, a substituted or unsubstituted aralkyl group, a substituted or unsubstituted aryl group, a substituted or unsubstituted heterocyclic group, or a halogen atom. The compound of Formula 25 is described in Japanese Patent Application Laid-Open No. 2004-107263, and the content of the document is all incorporated in the present specification by reference.

At least one organic material layer may be further included between the first n-type organic material layer and the light emitting layer. An electron transporting layer, a hole blocking layer, and the like having one or two or more layers may be provided between the first n-type organic material layer and the light emitting layer.

Hereinafter, each layer constituting the organic electroluminescent device according to the exemplary embodiment of the present specification will be described in detail. Materials of each layer to be described below may be a single material or a mixture of two or more materials.

Anode

An anode includes a metal, a metal oxide, or a conductive polymer. The conductive polymer may include an electrically conductive polymer. For example, the anode may have a work function value from about 3.5 eV to about 5.5 eV. Examples of exemplary conductive materials include carbon, aluminum, vanadium, chromium, copper, zinc, silver, gold, other metals, and an alloy thereof; zinc oxide, indium oxide, tin oxide, indium tin oxide (ITO), indium zinc oxide, and other similar metal oxides; a mixture of oxide and metal such as ZnO:Al and SnO$_2$:Sb, and the like. As a material for the anode, a transparent material or an opaque material may be used. In the case of a structure in which light is emitted in the anode direction, the anode may be transparently formed. Here, transparency is sufficient as long as light emitted from an organic material layer may be transmitted, and the transmittance of light is not particularly limited.

For example, when the organic electroluminescent device according to the present specification is a top emission type, and the anode is formed on the substrate before the organic material layer and the cathode are formed, an opaque material having excellent optical reflectance may also be used as a material for the anode in addition to a transparent material. For example, when the organic electroluminescent device according to the present specification is a bottom emission type, and the anode is formed on the substrate before the organic material layer and the cathode are formed, as a material for the anode, a transparent material is used, or an opaque material needs to be formed as a thin film enough to be transparent.

In the organic electroluminescent device according to the description of the present specification, a second p-type organic material layer may be included between the light emitting layer and the anode between which the second electric charge transporting passage is formed. FIG. 8 illustrates an energy flow when the second p-type organic material layer is provided. The second p-type organic material layer may be a hole injection layer (HIL) or a hole transporting layer (HTL). As a material for the second p-type organic material layer, it is possible to use the above-described materials mentioned as a material for the first p-type organic material layer.

A fourth n-type organic material layer may be provided between the second p-type organic material layer and the anode. Here, the difference between the HOMO energy level of the second p-type organic material layer and the LUMO energy level of the fourth n-type organic material layer may be 2 eV or less, or 1 eV or less, for example, about 0.5 eV. The second p-type organic material layer and the fourth n-type organic material layer may be in contact with each other. Accordingly, the second p-type organic material layer and the fourth n-type organic material layer may form an NP junction. FIG. 9 illustrates an energy flow when the fourth n-type organic material layer is provided.

The difference between the LUMO energy level of the fourth n-type organic material layer and the work function of the anode may be 4 eV or less. The fourth n-type organic material layer and the anode may be in contact with each other.

The fourth n-type organic material layer may have a LUMO energy level from about 4 eV to about 7 eV, and an electron mobility from about $10^{-8}$ cm$^2$/Vs to 1 cm$^2$/Vs, or from about $10^{-6}$ cm$^2$/Vs to about $10^{-2}$ cm$^2$/Vs. The fourth n-type organic material layer having an electric mobility within the range is advantageous for efficient injection of holes.

The fourth n-type organic material layer may also be formed of a material which may be vacuum deposited, or a material which may be thin-film molded by a solution process. Specific examples of the fourth n-type organic material include 2,3,5,6-tetrafluoro-7,7,8,8-tetracyanoquinodimethane (F4TCNQ), fluoro-substituted 3,4,9,10-perylenetetracarboxylic dianhydride (PTCDA), cyano-substituted PTCDA, naphthalene tetracaboxylic dianhydride (NTCDA), fluoro-substituted NTCDA, cyano-substituted NTCDA, or hexanitrile hexaazatriphenylene (HAT), but are not limited thereto.

When the fourth n-type organic material layer and the second p-type organic material layer form an NP junction, holes formed from the NP junction are transported to the light emitting layer through the second p-type organic material layer.

The second p-type organic material layer may include an aryl amine compound, a conductive polymer, or a block copolymer having both a conjugated portion and an unconjugated portion, and the like, but is not limited thereto.

Light Emitting Layer (EML)

In the light emitting layer, hole transfer and electron transfer occur at the same time, and thus the light emitting layer may have both n-type characteristics and p-type characteristics. For convenience, when electron transport is faster than hole transport, the light emitting layer may be defined as an n-type light emitting layer, and when hole transport is faster than electron transport, the light emitting layer may be defined as a p-type light emitting layer.

The n-type light emitting layer includes aluminum tris(8-hydroxy quinoline) (Alq$_3$); 8-hydroxy quinoline beryllium (BAlq); a benzoxazole-based compound, a benzthiazole-based compound or benzimidazole-based compound; a polyfluorene-based compound; a sila cyclopentadiene (silole)-based compound, and the like, but is not limited thereto.

The p-type light emitting layer includes a carbazole-based compound; an anthracene-based compound; a polyphenylenevinylene (PPV)-based polymer; or a spiro compound, and the like, but is not limited thereto.

Electron Transporting Layer (ETL)

In the present specification, the first n-type organic material layer may also be formed as an electron transporting layer, and an additional second n-type organic material layer may also be provided between the first n-type organic material layer and the light emitting layer. FIG. 6 illustrates an energy flow when the second n-type organic material layer is provided. The second n-type organic material layer may also serve as an electron transporting layer or a hole blocking layer. It is preferred that a material for the second n-type organic material layer is a material having a large electron mobility so as to transport electrons well. A third n-type organic material layer may also be provided between the second n-type organic material layer and the light emitting layer. The third n-type organic material layer may also serve as an electron transporting layer or a hole blocking layer. FIG. 7 illustrates an energy flow when the third n-type organic material layer is provided.

It is preferred that the first n-type organic material layer is composed of a material having a LUMO energy level of 2 eV or less and the first p-type organic material layer is composed of a material having a HOMO energy level of 2 eV or less, as described above. According to an example, the first n-type organic material layer may have a LUMO energy level from 5 eV to 7 eV.

It is preferred that the second n-type organic material layer has a LUMO energy level smaller than the LUMO energy level of the first n-type organic material layer. According to an example, the second n-type organic material layer may have a LUMO energy level from 2 eV to 3 eV. According to an example, the second n-type organic material layer may have a HOMO energy level from 5 eV to 6 eV, specifically, from 5.8 eV to 6 eV.

The second or third n-type organic material layer includes aluminum tris(8-hydroxy quinoline) (Alq$_3$); an organic compound including an Alq$_3$ structure; a hydroxyflavone-metal complex or a sila cyclopentadiene (silole)-based compound, and the like, but is not limited thereto. As a material for the second or third n-type organic material layer, the aforementioned material for the first n-type organic material layer may also be used. The second or third n-type organic material layer may be doped with an n-type dopant. According to an exemplary embodiment, when any one of the second n-type organic material layer and the third n-type organic material layer is doped with the n-type dopant, a host material of the doped layer and a material of the undoped layer may be the same as each other.

The n-type dopant may be an organic material or an inorganic material. When the n-type dopant is an inorganic material, the n-type dopant may include an alkali metal, for example, Li, Na, K, Rb, Cs, or Fr; an alkaline earth metal, for example, Be, Mg, Ca, Sr, Ba, or Ra; a rare earth metal, for example, La, Ce, Pr, Nd, Sm, Eu, Tb, Th, Dy, Ho, Er, Em, Gd, Yb, Lu, Y, or Mn; or a metal compound including one or more metals of the metals. Alternatively, the n-type dopant may also be a material including cyclopentadiene, cycloheptatriene, a six-membered heterocyclic ring, or a condensed ring including these rings. At this time, the doping concentration may be from 0.01% by weight to 50% by weight, or from 1% by weight to 10% by weight.

As a specific example, the organic electroluminescent device includes first to third n-type organic material layers, in which the first n-type organic material layer may include the compound of Formula 1, and the second n-type organic material layer may be doped with an n-type dopant. At this time, the second n-type organic material layer and the third n-type organic material layer may include the compound of Formula 5 as a host material.

Cathode

As described above, in the present specification, a cathode material may be selected from materials having various work functions by including the above-described first p-type organic material layer and first n-type organic material layer. It is preferred that the cathode material is usually a material having a small work function so as to facilitate electron injection. However, in the present specification, a material having a large work function may also be applied. Specifically, in the present specification, it is possible to use, as the cathode material, a material having a work function which is equal to or larger than the HOMO energy level of the first p-type organic material layer. For example, in the present specification, a material having a work function from 2 eV to 5 eV may be used as the cathode material. The cathode includes a metal such as magnesium, calcium, sodium, potassium, titanium, indium, yttrium, lithium, gadolinium, aluminum, silver, tin, and lead, or an alloy thereof; a multi-layer structured material such as LiF/Al or LiO$_2$/Al, and the like.

When Al is used as the cathode material, it is possible to provide a device capable of being efficiently operated by using Al either alone or together with LiF or Liq. In particular, when Ag is used as the cathode material, a device according to the related art is not operated well when Ag is used either alone or together with LiF or Liq, and thus as an organic material layer associated with the cathode, a layer composed of a metal such as an alkali metal or an alkaline earth metal, or an organic material layer doped with a metal needs to be used. However, in the exemplary embodiments described in the present specification, a material having a large work function, such as Ag, may be used as the cathode material without a metal layer or an organic material layer doped with a metal, as described above. In addition, in the exemplary embodiments described in the present specification, a transparent conductive oxide having a high work function such as IZO (work function from 4.8 eV to 5.2 eV) may also be used as the cathode material.

According to an exemplary embodiment of the present specification, the cathode may be provided so as to be in physical contact with the organic material layer. The organic material layer in contact with the cathode may be the above-described first p-type organic material layer, and may be an additional organic material layer. Here, the organic material layer which is in contact with the cathode may be non-doped.

In the organic electroluminescent device in the related art, when a cathode of a material having a large work function, such as Al or Ag, is used, it is necessary to dope an inorganic material layer such as an LiF layer between an organic material layer and the cathode, or the organic material layer with a metal. In the related art, when the cathode is in contact with the organic material layer without using the inorganic material layer or the organic material layer doped with the metal as described above, only a material having a work function of 2 eV or more and less than 3.5 eV may be used as the cathode material. However, in the organic electroluminescent device according to the present specification, even when the cathode is in contact with the organic material layer, a cathode may be configured by using a material having a work function of 3.5 eV or more by the first p-type organic material layer and the first n-type organic material layer.

According to an exemplary embodiment of the present specification, the cathode is provided so as to be in physical contact with the organic material layer, and the cathode is composed of a material having a work function of 3.5 eV or more.

According to an exemplary embodiment of the present specification, the cathode is provided so as to be in physical contact with the organic material layer, and the cathode is composed of a material having a work function of 4 eV or more.

According to an exemplary embodiment of the present specification, the cathode is provided so as to be in physical contact with the organic material layer, and the cathode is composed of a material having a work function of 4.5 eV or more.

The upper limit of the work function of the material constituting the cathode is not particularly limited, but it is possible to use a material having a work function of 5.5 eV or less from the viewpoint of selecting a material.

The cathode may be formed of a material which is the same as the anode. In this case, the cathode may be formed of the aforementioned materials exemplified as the material of the anode. Alternatively, the cathode or the anode may include a transparent material.

The thickness or shape or pattern form of the organic material layer described in the present specification, for example, the first and second p-type organic material layer, the first to fourth n-type organic material layer, the cathode, and the anode may be selected by those skilled in the art depending on the type of material or the role required in the device. The organic electroluminescent device according to an exemplary embodiment of the present specification may be a device including a light extraction structure.

In an exemplary embodiment of the present specification, the organic electroluminescent device further includes a substrate provided on a surface facing a surface on which the organic material layer of the anode or the cathode is provided, and a light extraction layer provided between the substrate and the anode or the cathode, or on a surface facing a surface on which the anode or the cathode of the substrate is provided.

In other words, the organic electroluminescent device may further includes an internal light extraction layer between the substrate, which is provided on a surface facing a surface on which the organic material layer of the anode or the cathode is provided, and the anode or the cathode. In another exemplary embodiment, an external light extraction layer may be additionally provided on a surface opposite to a surface on which the anode or the cathode is provided on the substrate.

In the present specification, the internal light extraction layer or the external light extraction layer is not particularly limited as long as the layer has a structure which may induce light scattering so as to improve the light extraction efficiency of the device. In an exemplary embodiment, the light extraction layer may be formed by using a film having a structure in which scattering particles are dispersed in a binder, or unevenness.

In addition, the light extraction layer may be directly formed on a substrate by a method such as spin coating, bar coating, slit coating, and the like, or may be formed by a method of manufacturing the layer in a film form and attaching the layer.

In an exemplary embodiment of the present specification, the organic electroluminescent device is a flexible organic electroluminescent device. In this case, the substrate includes a flexible material. For example, it is possible to use glass having a flexible thin film form, plastic, or a substrate having a film form.

A material of the plastic substrate is not particularly limited, but generally, a film of PET, PEN, PI, and the like may be used in the form of a single layer or plural layers.

In an exemplary embodiment of the present specification, a display apparatus including the organic electroluminescent device is provided.

In an exemplary embodiment of the present specification, an illumination apparatus including the organic electroluminescent device is provided.

Hereinafter, specific experimental examples of the above-described exemplary embodiments will be described. However, the following experimental examples are illustrative only, and are not intended to limit the range of the exemplary embodiments.

Experimental Example 1

An anode having a thickness of 1,000 Å was formed on a substrate by a sputtering method using IZO, and a p-type hole injection layer having a thickness of 500 Å was formed thereon by thermally vacuum depositing an m-MTDATA of the following Formula. Subsequently, a p-type hole transporting layer having a thickness of 400 Å was formed thereon by vacuum depositing the NPB of the following Formula.

Subsequently, a light emitting layer having a thickness of 300 Å was formed by doping a CBP of the following Formula with an Ir(ppy)$_3$ of the following Formula in an amount of 10% by weight. A hole blocking layer having a thickness of 50 Å was formed thereon using a BCP of the following formula.

An organic material layer having a thickness of 100 Å was formed thereon using an electron transporting material of the following formula, and an electron transporting layer having a thickness of 50 Å was formed thereon by doping the electron transporting material of the following formula with Ca in an amount of 10% by weight.

A first n-type organic material layer having a thickness of 300 Å was formed thereon using an HAT of the following Formula, which is an n-type organic material. A light scattering layer was formed thereon using a material selected from A to F described in the following Table 1. Subsequently, a first p-type organic material layer having a thickness of 50 Å was formed using the NPB as a p-type organic material.

TABLE 1

| | Material | Thickness of organic material layer (Å) |
|---|---|---|
| A | Compound of Formula 2-1 | 1,000 |
| B | NPB | 1,000 |
| C | Compound of Formula 2-1:NPB = 1:1 weight ratio | 2,000 |
| D | Compound of Formula 2-1:NPB = 7:3 weight ratio | 1,000 |
| E | Compound of Formula 2-1:NPB = 3:7 weight ratio | 1,000 |
| F | Compound of Formula 2-1:NPB = 1:1 weight ratio | 1,000 |

Finally, an organic electroluminescent device was manufactured by forming Ag as the cathode to have a thickness of 2,000 Å.

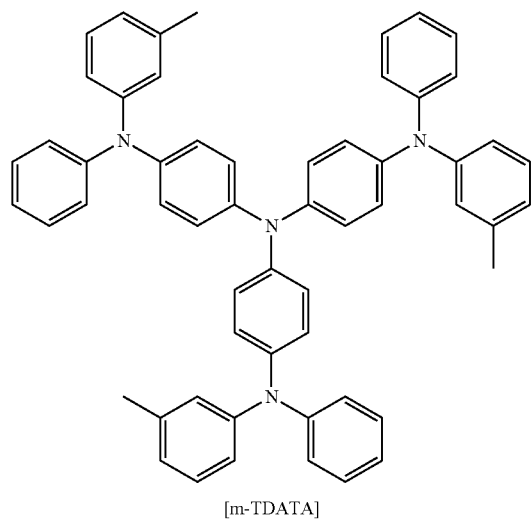

[m-TDATA]

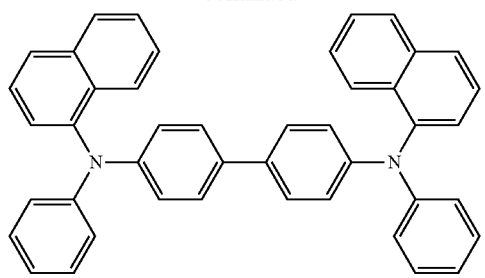

[NPB]

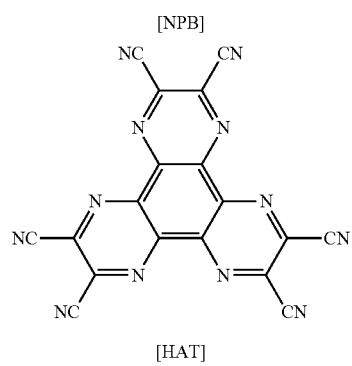

[HAT]

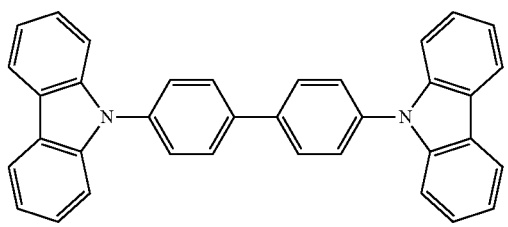

[CBP]

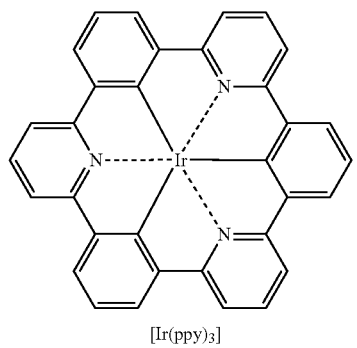

[Ir(ppy)$_3$]

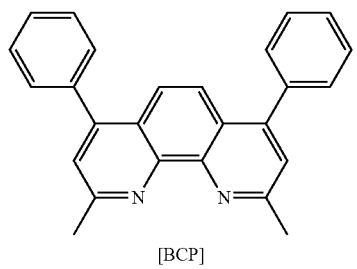

[BCP]

-continued

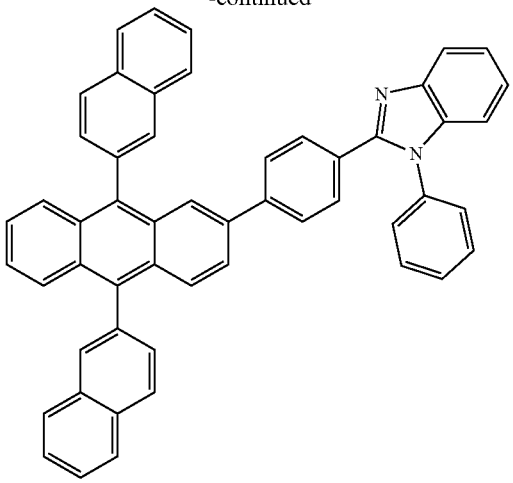

[Electron transporting material]

The deposition rate of the organic material in the process was maintained at a level from 0.5 Å/sec to 1 Å/sec, and the degree of vacuum during the deposition was maintained at a level from $2 \times 10^{-7}$ torr to $2 \times 10^{-8}$ torr.

FIGS. 10A to 10F illustrate SEM photographs illustrating the surface of the organic material layers formed by using the materials described in the Table. In FIGS. 10A, 10C, 10E, and 10F, roughness was observed to be large. In particular, in FIG. 10E, the roughness of particles formed by materials forming the layer was observed most frequently, and in this case, an effect was exhibited that the light extraction efficiency was increased by about 20% compared to the device B according to the change in passage of light generated in the device.

TABLE 2

|  | Driving voltage (@ 5 mA/cm$^2$) | External quantum efficiency (@ 5 mA/cm$^2$) |
| --- | --- | --- |
| FIG. 10A | 6.5 V | 9.0% |
| FIG. 10B | 7.8 V | 9.3% |
| FIG. 10C | 8.2 V | 11.6% |
| FIG. 10D | 8.0 V | 9.5% |
| FIG. 10E | 9.5 V | 11.2% |
| FIG. 10F | 8.0 V | 9.7% |

Experimental Example 2

An anode having a thickness of 1,000 Å was formed on a substrate by a sputtering method using IZO, and a p-type hole injection layer having a thickness of 500 Å was formed thereon by thermally vacuum depositing the m-MTDATA of the above Formula. Subsequently, a p-type hole transporting layer having a thickness of 400 Å was formed thereon by vacuum depositing the NPB of the above Formula.

Subsequently, a light emitting layer having a thickness of 300 Å was formed by doping the CBP of the above Formula with an Ir(ppy)$_3$ of the following Formula in an amount of 10% by weight. A hole blocking layer having a thickness of 50 Å was formed thereon using the BCP of the above Formula.

An organic material layer having a thickness of 100 Å was formed thereon using the electron transporting material of the above Formula, and an electron transporting layer having a thickness of 50 Å was formed thereon by doping the electron transporting material of the above formula with Ca in an amount of 10% by weight.

A first n-type organic material layer having a thickness of 300 Å was formed thereon using the HAT of the above Formula, which is an n-type organic material. A compound of the following Formula 3-1, which is a layer capable of serving as the first p-type organic material layer and the scattering layer, was formed to have a thickness of 500 Å and 5,000 Å, respectively, and was compared with the devices formed to have a thickness of 500 Å and 5,000 Å respectively by using the NPB as the Comparative Examples in terms of characteristics thereof.

Finally, an organic electroluminescent device was manufactured by forming Ag as the cathode to have a thickness of 2,000 Å.

[Formula 3-1]

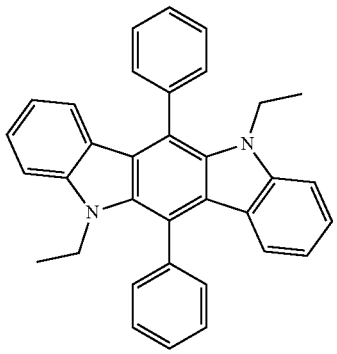

Characteristics of the device manufactured are shown in the following Table 3.

TABLE 3

|  | Driving voltage (@ 5 mA/cm$^2$) | External quantum efficiency (@ 5 mA/cm$^2$) |
| --- | --- | --- |
| Formula 3-1 500 Å | 8.6 V | 6.1% |
| Formula 3-1 5,000 Å | 9.6 V | 7.5% |
| NPB 500 Å | 7.4 V | 5.0% |
| NPB 5,000 Å | 9.0 V | 6.3% |

Table 3 shows a result that similarly to Experimental Example 1, the light extraction efficiency of a device in which a scattering layer is disposed at the cathode interface was increased by about 20% compared to a device in which the scattering layer is not disposed at the cathode interface.

In order to explore the possibility of using each layer as the light scattering layer, surface characteristics of a glass substrate, surface characteristics of the ITO layer after being formed on the glass substrate, and surface characteristics of the compound layer of Formula 3-1 after being formed on the ITO layer on the glass substrate were captured as SEM photographs for each thickness of each layer, and the results are illustrated in FIGS. 11A to 11C. It can be seen that the compound of Formula 3-1 may be used as a material of the light scattering layer described in the present specification, depending on the thickness of the layer. In FIG. 11A to 11C, the thickness means a thickness of the uppermost layer.

The invention claimed is:
1. An organic electroluminescent device comprising:
an anode;
a cathode;

a light emitting layer provided between the anode and the cathode;

a first p-type organic material layer provided between the light emitting layer and the cathode;

a first n-type organic material layer provided between the light emitting layer and the first p-type organic material layer; and a light scattering layer provided between the light emitting layer and the cathode, wherein the light scattering layer is the first p-type organic material layer, or is provided between the first p-type organic material layer and the first n-type organic material layer, and wherein the light scattering layer comprises a polycyclic condensed ring compound and an aryl amine compound.

2. The organic electroluminescent device of claim 1, further comprising:

a first electric charge transporting passage provided between the light emitting layer and the cathode; and a second electric charge transporting passage provided between the light emitting layer and the anode, wherein the first electric charge transporting passage comprises the first p-type organic material layer associated with the cathode; and the first n-type organic material layer provided between the first p-type organic material layer and the light emitting layer.

3. The organic electroluminescent device of claim 1, further comprising:

a buffer layer provided between the light emitting layer and the cathode, wherein the buffer layer includes: the first p-type organic material layer associated with the cathode; and the first n-type organic material layer provided between the first p-type organic material layer and the light emitting layer.

4. The organic electroluminescent device of claim 1, wherein the light scattering layer comprises a light scattering structure provided in or on a surface of the layer.

5. The organic electroluminescent device of claim 4, wherein the light scattering layer is formed of an organic material.

6. The organic electroluminescent device of claim 4, wherein the light scattering structure is a particle structure formed by constituting a cluster of organic material molecules.

7. The organic electroluminescent device of claim 4, wherein the light scattering structure is formed by depositing an organic material.

8. The organic electroluminescent device of claim 6, wherein a particle diameter of the particle is from 0.5 micron to 30 micron.

9. The organic electroluminescent device of claim 6, wherein a degree of roughness of the particle structure is from 2 nm to 50 nm.

10. The organic electroluminescent device of claim 1, wherein the aryl amine compound comprises a compound of the following Formula 1:

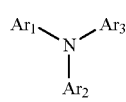

[Formula 1]

in Formula 1, $Ar_1$, $Ar_2$, and $Ar_3$ are each independently hydrogen or a hydrocarbon group.

11. The organic electroluminescent device of claim 10, wherein the aryl amine compound comprises NPB (N,N'-bis(naphthyl)-N,N'-bis(phenyl)benzidine).

12. The organic electroluminescent device of claim 1, wherein the polycyclic condensed ring compound comprises a compound of the following Formula 2:

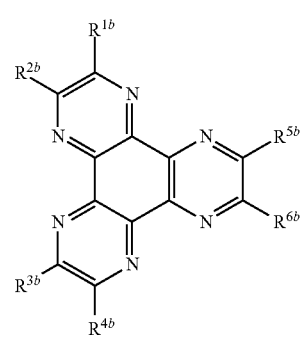

[Formula 2]

in Formula 2, $R^{1b}$ to $R^{6b}$ are each hydrogen, a halogen atom, nitrile (—CN), nitro (—NO$_2$), sulfonyl (—SO$_2$R), sulfoxide (—SOR), sulfonamide (—SO$_2$NR), sulfonate (—SO$_3$R), trifluoromethyl (—CF$_3$), ester (—COOR), amide (—CONHR or —CONRR'), a substituted or unsubstituted straight or branched $C_1$ to $C_{12}$ alkoxy, a substituted or unsubstituted straight or branched $C_1$ to $C_{12}$ alkyl, a substituted or unsubstituted straight or branched $C_2$ to $C_{12}$ alkenyl, a substituted or unsubstituted aromatic or non-aromatic heterocyclic ring, a substituted or unsubstituted aryl, a substituted or unsubstituted mono- or di-aryl amine, or a substituted or unsubstituted aralkyl amine, wherein R and R' are each a substituted or unsubstituted $C_1$ to $C_{60}$ alkyl, a substituted or unsubstituted aryl, or a substituted or unsubstituted 5- to 7-membered heterocyclic ring.

13. The organic electroluminescent device of claim 12, wherein the Formula 2 is selected from the following Formulas 2-1 to 2-6:

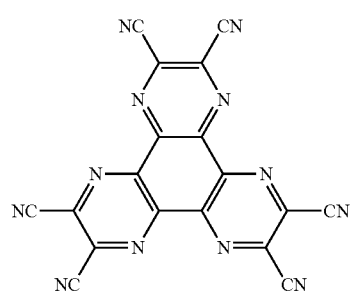

[Formula 2-1]

[Formula 2-2]

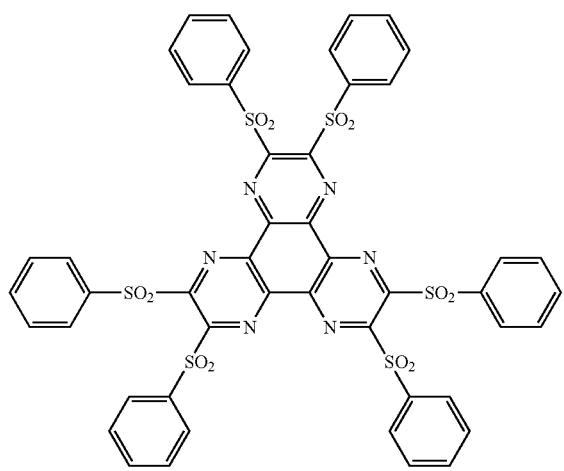

[Formula 2-3]

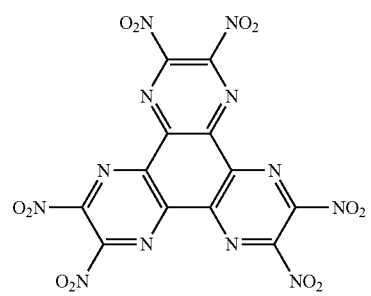

[Formula 2-4]

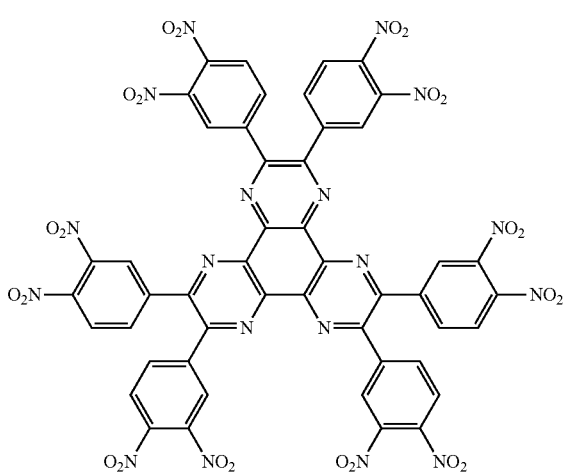

[Formula 2-5]

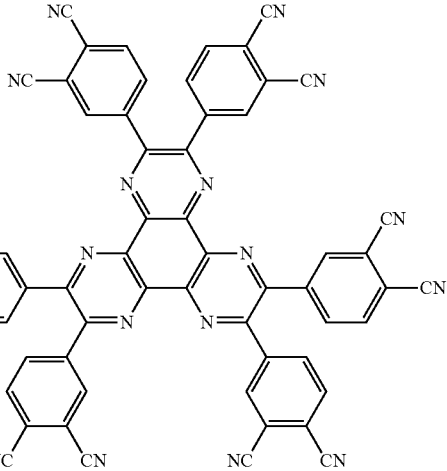

[Formula 2-6]

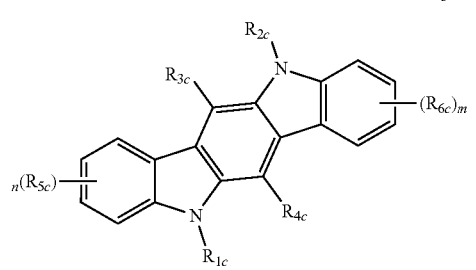

14. The organic electroluminescent device of claim 1, wherein a weight ratio of a content of the polycyclic condensed compound to a content of the aryl amine compound in the light scattering layer is from 1/7 to 5/7.

15. The organic electroluminescent device of claim 4, wherein the light scattering layer comprises a compound of the following Formula 3:

[Formula 3]

in Formula 3, $R_{1c}$ to $R_{6c}$ are the same as or different from each other, are each independently a hydrogen atom; a $C_1$ to $C_{30}$ alkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; a $C_3$ to $C_{30}$ cycloalkyl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; a $C_6$ to $C_{30}$ aryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group; or a $C_2$ to $C_{30}$ heteroaryl group which is unsubstituted or substituted with one or more groups selected from the group consisting of a halogen atom, an amino group, a nitrile group, a nitro group, a $C_1$ to $C_{30}$ alkyl group, a $C_2$ to $C_{30}$ alkenyl group, a $C_1$ to $C_{30}$ alkoxy group, a $C_3$ to $C_{30}$ cycloalkyl group, a $C_3$ to $C_{30}$ heterocycloalkyl group, a $C_6$ to $C_{30}$ aryl group, and a $C_2$ to $C_{30}$ heteroaryl group, and are able to form an aliphatic, aromatic, aliphatic hetero, or aromatic hetero condensation ring or a spiro bond in conjunction with an adjacent group, and n and m are each an integer from 0 to 4.

16. The organic electroluminescent device of claim 15, wherein the compound of Formula 3 is represented by any one of the following Formulas 3-1 to 3-5:

[Formula 3-1]

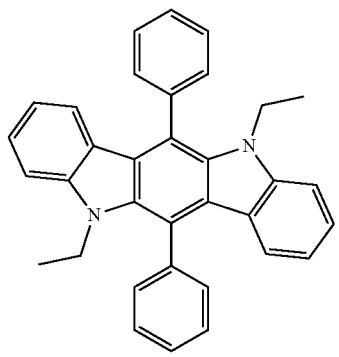

[Formula 3-2]

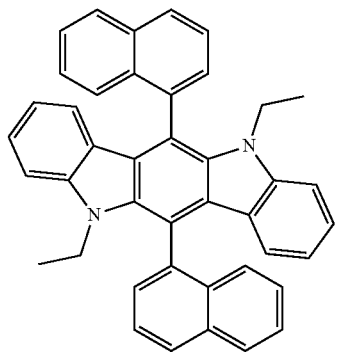

[Formula 3-3]

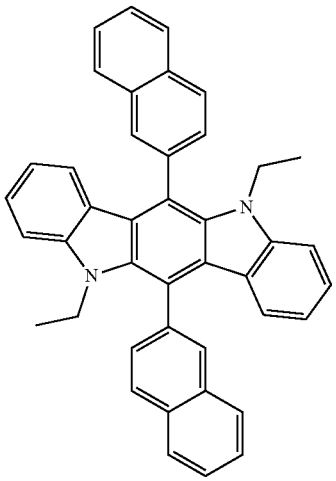

[Formula 3-4]

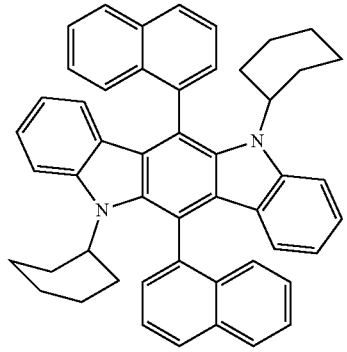

[Formula 3-5]

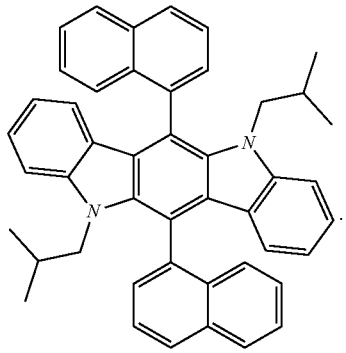

17. The organic electroluminescent device of claim 2, wherein a work function of the cathode is at a HOMO energy level or less of the first p-type organic material layer.

18. The organic electroluminescent device of claim 2, wherein a difference between the HOMO energy level of the first p-type organic material layer and a LUMO energy level of the first n-type organic material layer is 2 eV or less.

19. The organic electroluminescent device of claim 2, further comprising:
a second n-type organic material layer provided between the first n-type organic material layer and the light emitting layer.

20. The organic electroluminescent device of claim 19, wherein the second n-type organic material layer is doped with an n-type dopant.

21. The organic electroluminescent device of claim 19, further comprising:

a third n-type organic material layer provided between the second n-type organic material layer and the light emitting layer.

22. The organic electroluminescent device of claim 2, wherein the cathode is in contact with the first p-type organic material layer.

23. The organic electroluminescent device of claim 2, wherein the first n-type organic material layer and the first p-type organic material layer form an NP junction.

24. The organic electroluminescent device of claim 2, further comprising:
a second p-type organic material layer provided between the light emitting layer and the anode.

25. The organic electroluminescent device of claim 24, further comprising:
a fourth n-type organic material layer provided between the anode and the second p-type organic material layer.

26. The organic electroluminescent device of claim 25, wherein the second p-type organic material layer and the fourth n-type organic material layer form an NP junction.

27. The organic electroluminescent device of claim 1, further comprising:
a substrate provided on a surface opposite to a substrate on which the organic material layer of the cathode or the anode is provided; and
a light extraction layer provided between the cathode or the anode and the substrate, or on a surface opposite to a surface on which the anode or the cathode of the substrate is provided.

28. The organic electroluminescent device of claim 1, wherein the organic electroluminescent device is a flexible organic electroluminescent device.

29. A display comprising the organic electroluminescent device of claim 1.

30. An illumination apparatus comprising the organic electroluminescent device of claim 1.

31. The organic electroluminescent device of claim 1, wherein the first p-type organic material layer is non-doped.

* * * * *